United States Patent
Espinosa et al.

(10) Patent No.: US 8,751,206 B1
(45) Date of Patent: *Jun. 10, 2014

(54) ONLINE ENGINEERING TOOL SYSTEM FOR SPECIFYING THE VARIOUS COMPONENTS OF A HOLDOWN SYSTEM

(71) Applicant: Earthbound Corporation, Monroe, WA (US)

(72) Inventors: Thomas M. Espinosa, Snohomish, WA (US); Edward Wayne Chin, Snohomish, WA (US); Johan Lockhart Pingree, Kirkland, WA (US)

(73) Assignee: Earthbound Corporation, Monroe, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/761,335

(22) Filed: Feb. 7, 2013

Related U.S. Application Data

(63) Continuation of application No. 12/585,747, filed on Sep. 23, 2009, now Pat. No. 8,380,470.

(60) Provisional application No. 61/136,646, filed on Sep. 23, 2008.

(51) Int. Cl.
*G06G 7/48* (2006.01)

(52) U.S. Cl.
USPC .......................................... 703/6; 52/293.3

(58) Field of Classification Search
USPC .......... 703/2, 6; 52/223.4, 505, 167.1, 223.1, 52/293.3, 295, 79.1, 782.1, 93.2; 403/25
See application file for complete search history.

(56) References Cited

U.S. PATENT DOCUMENTS

| | | | |
|---|---|---|---|
| 4,875,314 A * | 10/1989 | Boilen | 52/167.1 |
| 5,782,048 A * | 7/1998 | Ramirez | 52/295 |
| 7,243,464 B1 * | 7/2007 | Crowell | 52/93.2 |
| 7,516,582 B2 * | 4/2009 | Leek | 52/223.1 |
| 2003/0009964 A1 * | 1/2003 | Trarup et al. | 52/295 |
| 2004/0068947 A1 * | 4/2004 | Commins et al. | 52/293.3 |
| 2004/0237439 A1 * | 12/2004 | Powell | 52/505 |
| 2005/0108986 A1 * | 5/2005 | Cloyd et al. | 52/782.1 |
| 2006/0277844 A1 * | 12/2006 | Mueller | 52/167.1 |
| 2007/0130857 A1 | 6/2007 | Espinosa | |
| 2007/0209314 A1 | 9/2007 | Vaughn | |
| 2008/0060297 A1 * | 3/2008 | Espinosa | 52/293.3 |
| 2008/0134589 A1 * | 6/2008 | Abrams et al. | 52/79.1 |
| 2008/0245004 A1 * | 10/2008 | Pryor et al. | 52/223.4 |
| 2008/0289267 A1 | 11/2008 | Sarkisian | |
| 2008/0295428 A1 | 12/2008 | Cloyd et al. | |
| 2009/0257821 A1 * | 10/2009 | Ghosh et al. | 403/205 |

* cited by examiner

*Primary Examiner* — Kandasamy Thangavelu
(74) *Attorney, Agent, or Firm* — Shlesinger, Arkwright & Garvey LLP

(57) ABSTRACT

Computerized online engineering tool system for specifying the various components of a holdown system that assemble a run comprising a tie rod in a frame wall structure from the foundation up through the walls to the top floor, and bearing members and tension devices securing the tie rod to the wall. The system comprises a server; a database of drawing elements and hardware component parts; a program operably associated with the server and the database with the steps of i) allowing a user to login into the server; ii) allowing the user to select options for the run; iii) providing the user a data input and calculated data page for the load at each framing level and rod size sufficient to handle the load; and allowing the user to download a shop or installation drawing of the run generated using the drawing elements and hardware component parts from the database.

21 Claims, 27 Drawing Sheets

How to use this page      Close

1. Input the uplift load starting at the anchorage point
2. use your tab key to move up to the next level
3. at your topmost uplift load tab again to the *Calculate Loads* link
4. use your enter key to initiate a caculation of the page.
5. after the initial calculation the *Override* features will be available for use.

The Overrided features:
Overriding the rod size will effect the rod elongation. If an over sized rod is selected the page will update the elongation value. Overriding the load compression value will effect the wood posting requirements and will be shown on the final shop drawing.
Run Notes: will be shown on the final shop drawing.

FIG. 15B

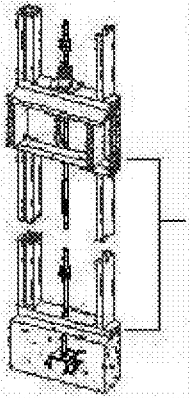

*Plate To Plate Description*      Close

For the current wall: From the bottom of it's bottom plate to the top of it's top plate.

FIG. 15C

Project: My Project
Run Name: My run
Quantity: 1 Run

| Wood Floor Level | Uplift Tension Loads | Diff. Loads | Collected Diff. Loads | Rod Tension loads | Wood Compr. Loads |
|---|---|---|---|---|---|
| 4 | 6000 | 6000 | 6000 | 6000 | 6000 |
| 3 | 8000 | 2000 | 2000 | 8000 | 8000 |
| 2 | 10000 | 2000 | 2000 | 1000 | 10000 |
| 1 | 16000 | 6000 | 6000 | 16000 | 16000 |

| | | | |
|---|---|---|---|
| Bridge Holddown: | SJA426 | Required Bridge Trimmers | |
| Bridge Plate: | P8 | Wall Type: | HF Studs/DF Plates |
| Bridge: | Solid Lumber | Bridge Height: | 4'-6" |
| Rod: | R6 | 2x4 or 3X4 wall: | 2x4 + (HD Bay) + 2x4 |
| Coupler: | C66 | 2x6 wall: | 2x6 + (HD Bay) + 2x6 |
| Holddown: | SJA426 | Required Collector Studs | |
| Plate: | P8 | Wall Type: | HF Studs/DF Plates |
| Rod: | R6 | Wall Height: | 10'-0" |
| Coupler: | C66 | 2x4 wall: | 3-2x4 + (HD Bay) + 2-2x4 |
| Holddown: | SJA416 | 2x6 wall: | 2x6 + (HD Bay) + 2x6 |
| Plate: | P8 | 3x4 wall: | 3-3x4 + (HD Bay) + 3x4 |
| Rod: | R6HS | Required Collector Studs | |
| Coupler: | C66 HS | Wall Type: | HF Studs/DF Plates |
| Holddown: | SJA416 | Wall Height: | 10'-0" |
| Plate: | P8 | 2x4 wall: | 4x4 + (HD Bay) + 1-4x4 + 1-2x4 |
| | | 2x6 wall: | 2x6 + (HD Bay) + 2x6 |
| | | 3x4 wall: | 2-3x4 + (HD Bay) + 2-3x4 |
| Rod: | R6HS | Required Collector Studs | |
| Coupler: | C66 HS | Wall Type: | HF Studs/DF Plates |
| | | Wall Height: | 10'-0" |
| Anchor Bolt: | AB6HS-18(inches) | 2x4 wall: | 4x6 + (HD Bay) + 4x8 |
| Nut: | N6HS | 2x6 wall: | 2-2x6 + (HD Bay) + 2-2x6 |
| Plate: | AP3 | 3x4 wall: | 2-3x4 + (HD Bay) + 4-3x4 |
| Chair: | CHR15-13 | | |
| Nut: | N6HS | | |

FIG. 24

ONLINE ENGINEERING TOOL SYSTEM FOR SPECIFYING THE VARIOUS COMPONENTS OF A HOLDOWN SYSTEM

RELATED APPLICATION

This is a nonprovisional application claiming the priority benefit of provisional application Ser. No. 61/136,646, filed Sep. 23, 2008, hereby incorporated by reference.

FIELD OF THE INVENTION

The present invention is generally directed to a tension holdown system used in walls in light frame construction to resist uplift and to compensate for wood shrinkage in wood frame construction and compression loading. In particular, the present invention is a computerized online engineering tool system for specifying the various components of a holdown system that make up a run comprising a tie rod extending inside a wall from the foundation through the top floor, and bearing members and tension devices securing the tie rod to the wall.

SUMMARY OF THE INVENTION

The present invention provides an online computerized engineering tool system used to produce holdown designs "on-the-fly" from over 1000 holdown parts and a library of over 550 drawing elements from which this system will automatically build reports and drawings. The tool system provides a complete report, including drawings of a holdown run, listing the various components required for the specified run. The report can be incorporated into the engineer's design package for presentation to a customer.

A holdown run comprises a tie rod that extends from the foundation through the top floor and several components that secure the tie rod at the foundation, floor, midfloor and top floor levels.

The present invention provides a computerized online engineering tool system for specifying the various components of a holdown system that assemble a run comprising a tie rod extending inside a frame wall structure from the foundation up through the walls to the top floor, and bearing members and tension devices securing the tie rod to the wall. The system comprises a server; a database of drawing elements and hardware component parts; a program operably associated with the server and the database. The program includes the steps of allowing a user to login into the server; allowing the user to select options for the run; allowing the user to input load at each framing level and displaying to the user a rod size sufficient to handle the load; and allowing the user to download a shop or installation drawing of the run generated using the drawing elements and hardware component parts from the database.

The present invention also provides a method for specifying the various components of a holdown system that assemble a run, comprising a tie rod extending inside a frame wall structure from the foundation through the wall up to the top floor, and bearing members and tension devices securing the tie rod to the wall. The method comprises the steps of providing a server for connection to a user's computer; providing a database of drawing elements and hardware component parts; allowing the user's computer to be connected to the server; allowing the user to select options for the run; allowing the user to input load at each framing level and displaying to the user rod size sufficient for carrying the load; and allowing the user to print a shop or installation drawing of the run meeting the load, including a table of calculated values, or a schedule of components needed to build the run using the drawing elements and hardware component parts from the database.

The present invention will become apparent from the following detailed description.

BRIEF DESCRIPTIONS OF THE DRAWINGS

FIGS. 15B-15E show windows linked to hypertext in FIG. 15A.

FIG. 24 is a sample report shown in FIG. 19 of the Print Report tab page.

DETAILED DESCRIPTION OF THE INVENTION

Figure 1:
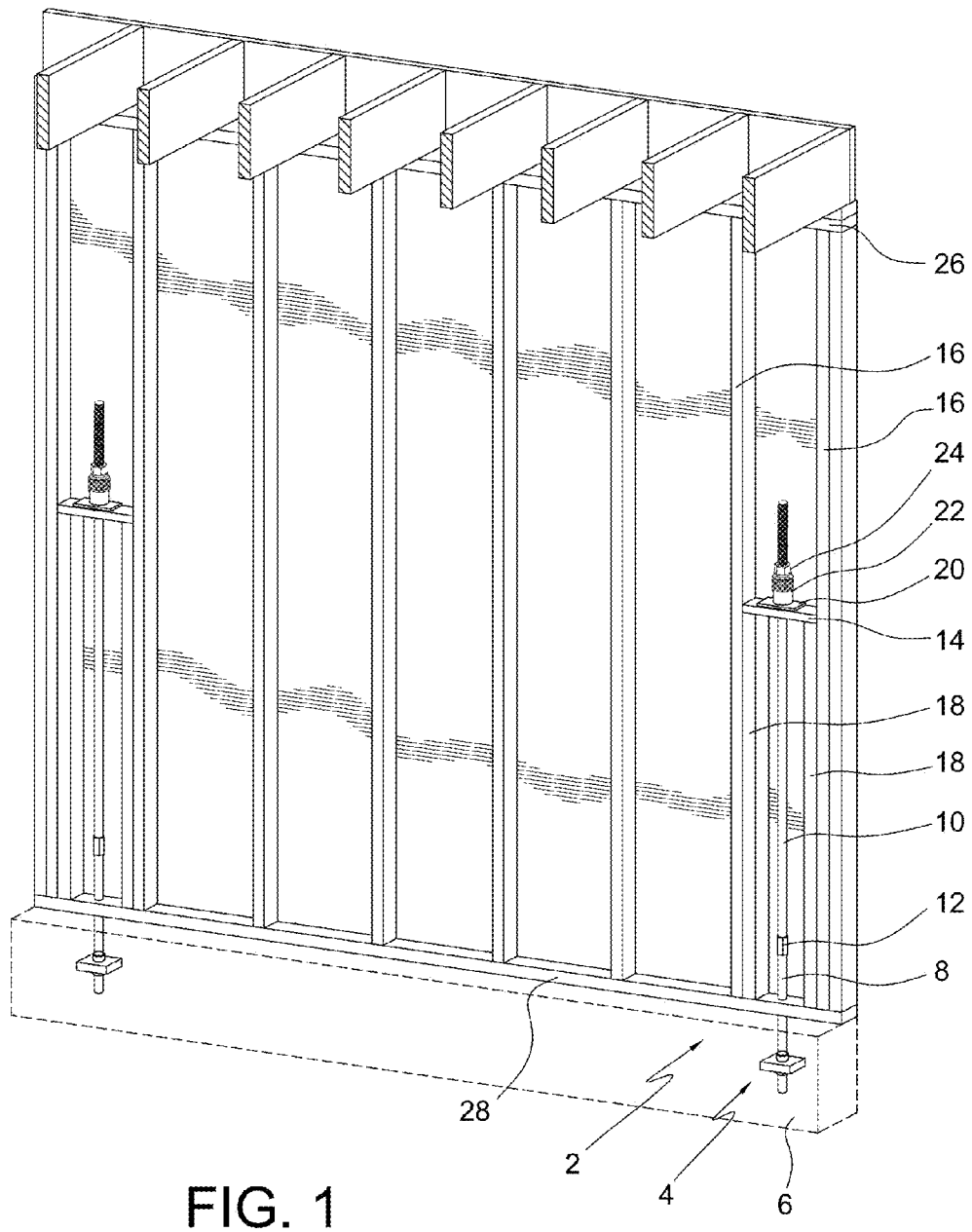
FIG. 1 is a perspective view of a one level run inside a stud wall of a one story building.

Referring to FIG. 1, an example of a one level run, using a holdown system 2 in a one level structure. The system 2 includes a foundation anchor 4 operably attached to a foundation 6 of a building. The foundation anchor 4 includes a threaded rod 8 attached to another threaded or tie-rod rod 10 by means of a coupling 12. A bridge member 14 spans between two adjacent studs 16 and is supported by a pair of reinforcement studs 18. A bearing plate 20 sits on top of the bridge member 14. The threaded rod 10 extends through the bridge member 14 and the bearing plate 20 through respective openings. A holdown device 22 is secured between the bearing plate 20 and a nut 24. The holdown device 22 is a tensioning device, such as the IMPASSE device (U.S. Pat. No. 6,951,078) and the SLACKJACK device, both available from Earthbound Corporation, Monroe, Wash. The device 22 is an expanding fastener assembly used to take up any slack that may develop in the tie rod 10 due to shrinkage in the building wall. The reinforcement studs 18 terminate between the top plate 26 and the bottom plate 28.

The building foundation refers generally to any structure that is used to anchor or tie a building to the ground. Examples are post tension deck (PTD), slab on grade (SOG), slab drilled and epoxy studs inserted (Epoxy), coupler welded to beam (Steelbeam), drilled and secured from the bottom of the woodbeam (Woodbeam) foundation walls, and any substantial structure solidly anchored in the ground. Accordingly, a building foundation can be any structure that is capable of transferring the load of the building to the ground.

Figure 2:
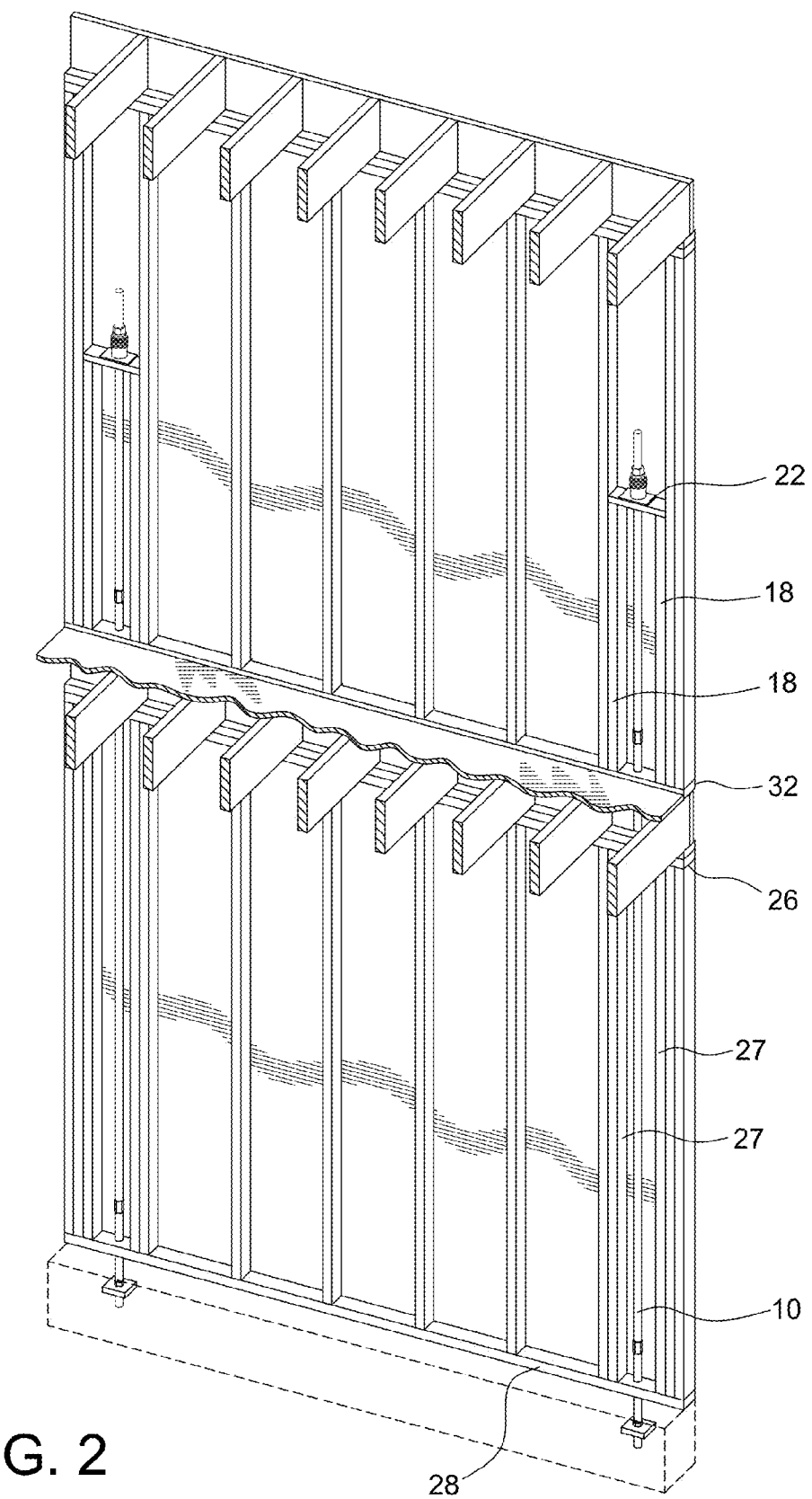
FIG. 2 is a perspective view of a two level run inside a stud wall of a two story building.

FIG. 2 shows a two level run, using the holdown system 2 in a two story building. The holdown device 22 is disposed within the stud wall of the second floor. Reinforcement studs 27 extending from the bottom plate 28 to the top plate 26 are provided in the wall below the reinforcement studs 18 installed in the second floor wall. The bottom ends of the reinforcement studs 18 rest on the bottom plate 32 of the second floor wall.

Figure 3:
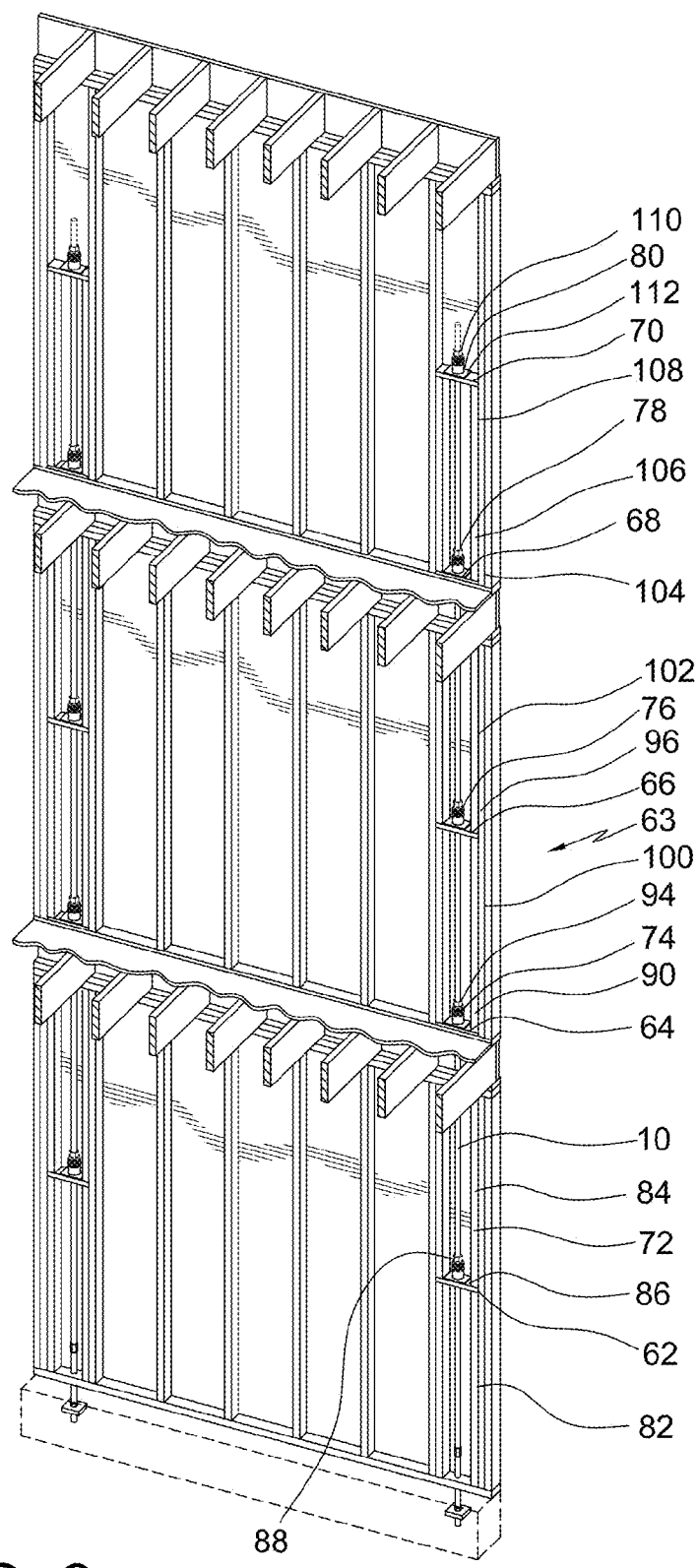
FIG. 3 is a perspective view of a three level run inside a stud wall of a three story building.

An example of a three level run, using a holdown system 63 in a three story building is shown in FIG. 3. The tie-rod 10 extends inside the stud wall through the first floor wall, second floor wall and terminates in the third floor wall. Bridge members 62, 64, 66, 68 and 70 along with holdown devices 72, 74, 76, 78 and 80 keep the tie rod 10 under tension. The bridge member 62 is supported by reinforcement studs 82 and 84 with the adjacent ends of the reinforcement studs sandwiching the respective ends of the bridge member 62. The holdown device 62 is disposed between a bearing plate 86 and a nut 88.

The holdown device 74 also bears down on a bearing plate 90 supported by the bridge member 64, which in turn bears down on the bottom plate. A nut 94 secures the holdown device 74 to the tie rod 10. The bottom ends of the reinforcement studs 100 bear down on the bridge member 64, transferring the load to the bottom plate and to the reinforcement studs 84 and 82 below.

The holdown device 76 along with its bridge member 66 and a bearing plate 96 and its respective nut 98 are similarly installed as the holdown device 62. The reinforcement studs 100 and 102 similarly secure the bridge member 66 to the stud wall. The reinforcement studs 102 bear down on the bridge member 66, transferring the load to the reinforcement studs 100.

The holdown device 78 along with its bridge member 68, its bearing plate 104 and nut 106 are similarly secured as the holdown device 74. The ends of reinforcement studs 108 bear down on the bridge member 68, transferring the load to the base plate and to the reinforcement studs 102 below. The bridge member 70 is supported on the top edge of the reinforcement studs 108 and is secured to the tie rod with nut 110. Bearing plate 112 is disposed between the bridge member 70 and the holdown device 80.

The online engineering tool system, as will be described in the following description, calculates the loads expected at each level of the run, specifies the various components, and generates a shop detail sheet; a report containing an image of the run, schedule of components needed to build the run, table of calculated loads and schedule of compression lumber options; and a DXF (drawing exchange file) drawing showing framing elements in which the holdown system is installed. Examples of the various outputs of the system in pdf format are attached at the end of the Annex.

Figure 4:
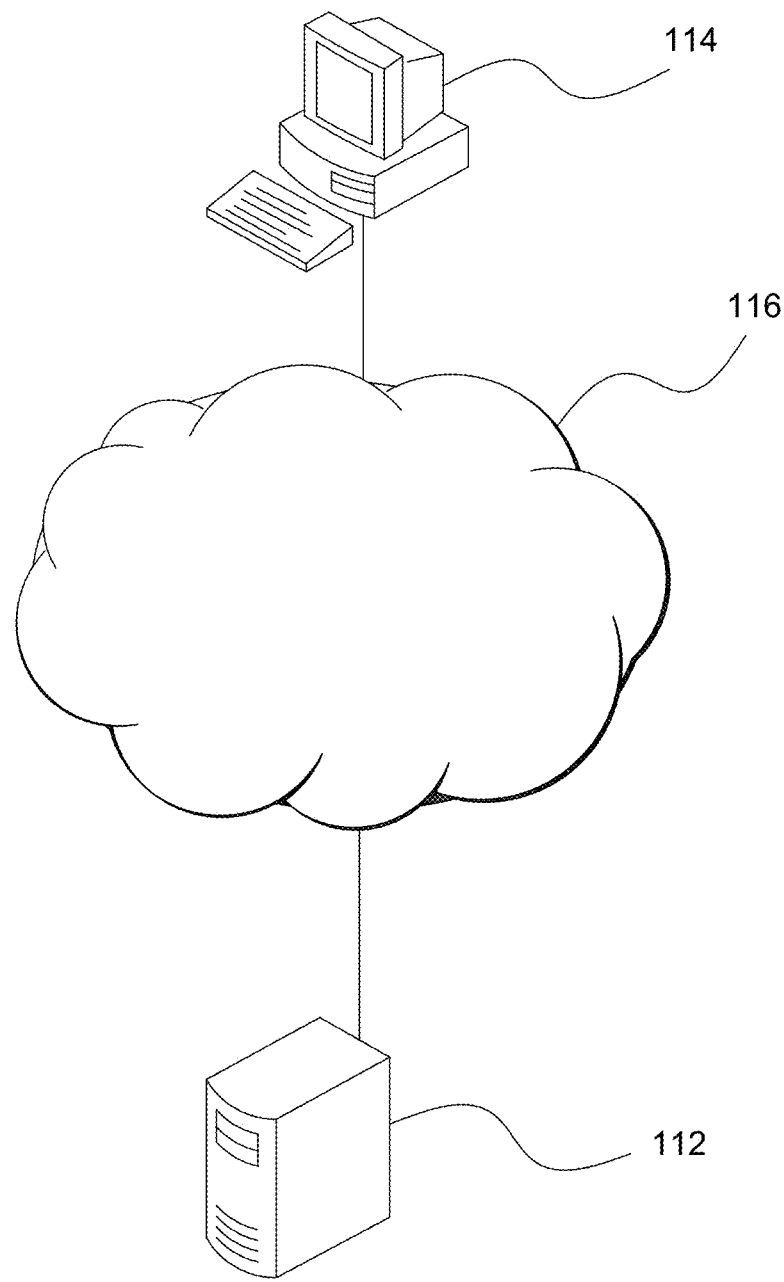
FIG. 4 is a schematic diagram of a user's computer connected to a server through the Internet.

Referring to FIG. 4, the system comprises a server 112 accessible by a user's computer 114 connected to the Internet 116. Any user with an internet browser can access the server after authentication. A program as described herein resides in the server 112 to allow the user to properly specify a run.

Assemble DXF Data

The system SQL database contains project data, DXF library and holdown components. From a library of DXF drawings (blocks) the process assembles those drawings in to a representation of a run in a shear wall for use in CAD. The process replaces text in the DXF files to match the assigned materials predetermined in the previous calculations. The resulting assemblies are provided "on-the-fly."

Calculations

Each floor is calculated to the specifications provided by the user input; wall height, lumber type, uplift load, IBC (International Building Code) and wood species. This produces the rod size, coupler, tensioning device and resulting design loads. This information is assigned to that run and level/floor then stored in the database for use later in the assembly of the DXF and reports.

Figure 5:
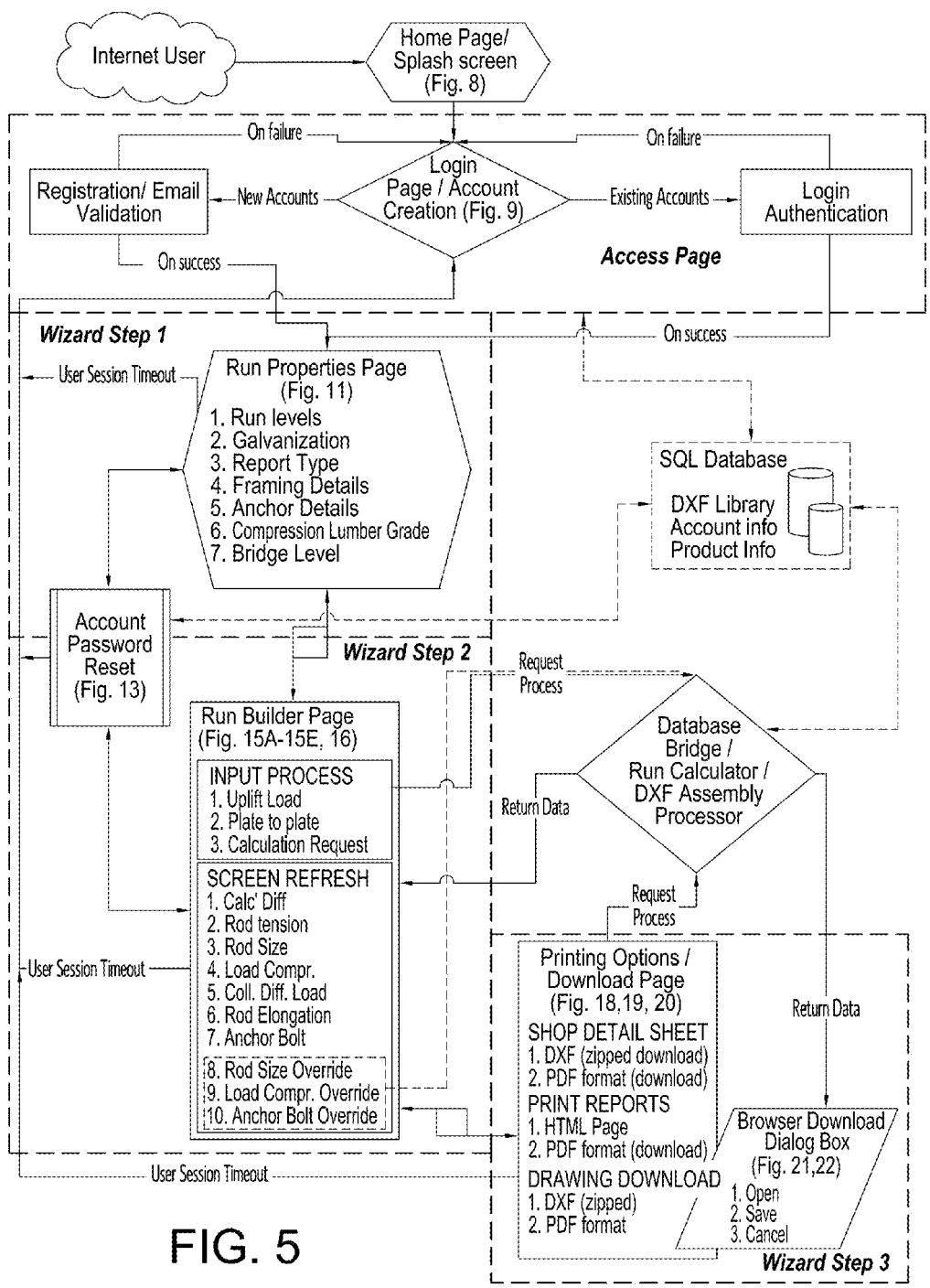
FIG. 5 shows a process flow chart of a client browser to server communications process embodying the present invention.

Referring to FIG. 5, a process flow diagram of a computerized online engineering tool system for specifying the various components of a holdown system that make up a run is disclosed. A client browser to server communication process is shown. The client browser is used to select options and input data which is sent to the server for analysis and processing. Upon completion at the server, data is returned to the client and stored in the cookie of the client browser. Some data is stored in a server cookie as well, known as session cookies. Sessions are directly tied to the client browser through a GUID (Globally unique ID).

This system is built upon the Microsoft DotNetwork Framework using the 3.5 version. The language of the server side code is written in is C# (pronounced: C-sharp).

The client web pages are written to target all modern browsers but caters to the browsers that have XHTML compliant technology and utilize the latest version of JavaScript.

This web site takes extensive advantage of AJAX (asynchronous JavaScript and XML) technology. It is not a programming language but a new way to use existing technology. Made popular by Google in 2005.

Figure 6:
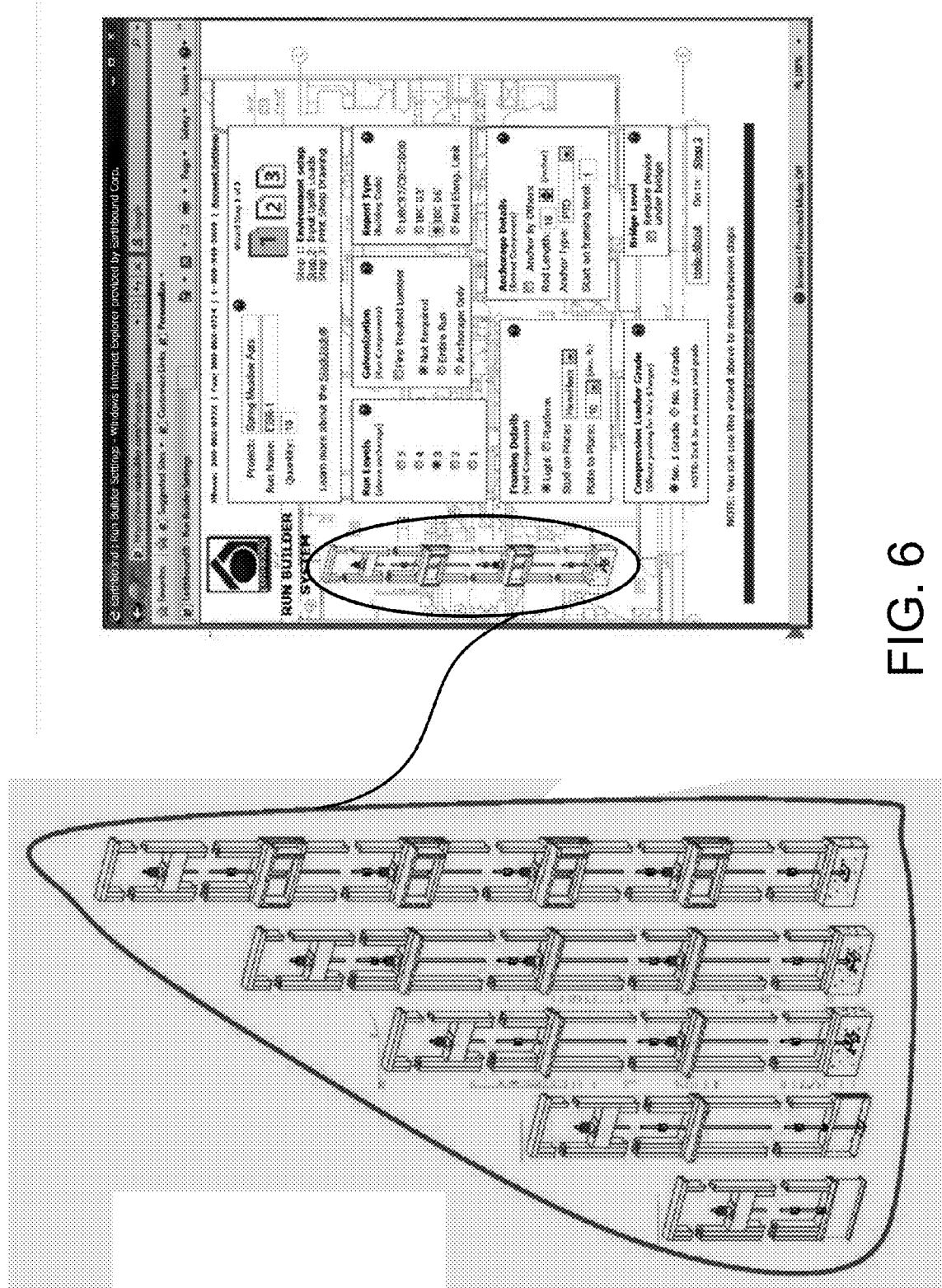
FIG. 6 is a screen shot of an Environmental Setup page of the system of FIG. 5, showing enlarged views of the runs generated on the fly by user selections.

Referring to FIG. 6, the system provides dynamically changing run images. Selection of any of several of the properties on the environment settings page will dynamically update the image of the run on this page. The example progression shown, left to right, is a single story with a steelbeam anchorage, a two story with wood beam anchorage, a three story with PTD anchorage, a four story with PTD anchorage and holdown device required under the bridge and a five story with SOG anchorage. All images are created "on-the-fly" by user selections.

Figure 7:
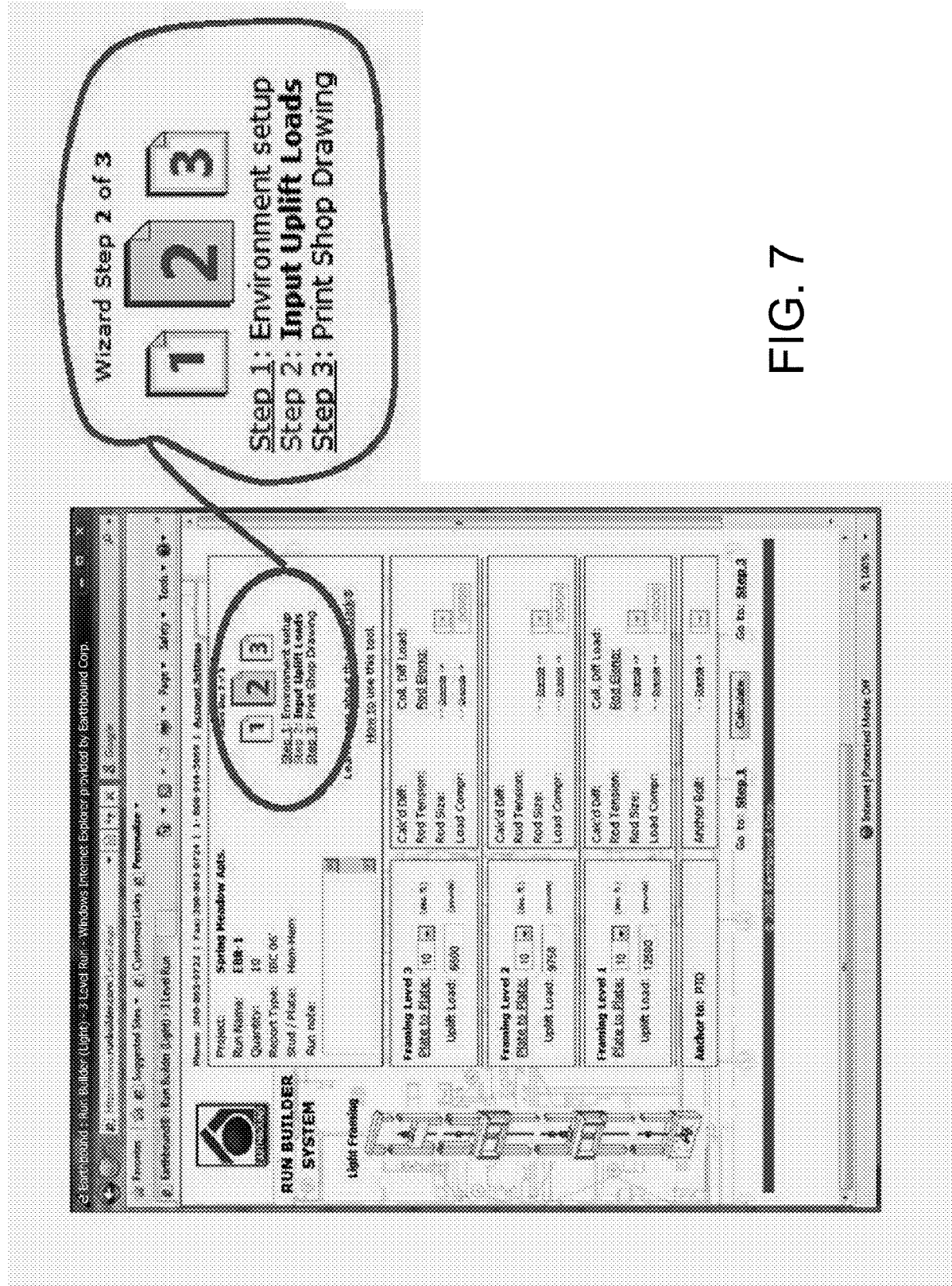
FIG. 7 is a screen shot of an Input Uplift Loads page of the system of FIG. 5.

Referring to FIG. 7, the system provides a Wizard Step-through 1, 2, 3. The wizard allows the user to easily step from one process to the next and back again without losing data that had already been entered into this systems process of building a run.

Figure 8:
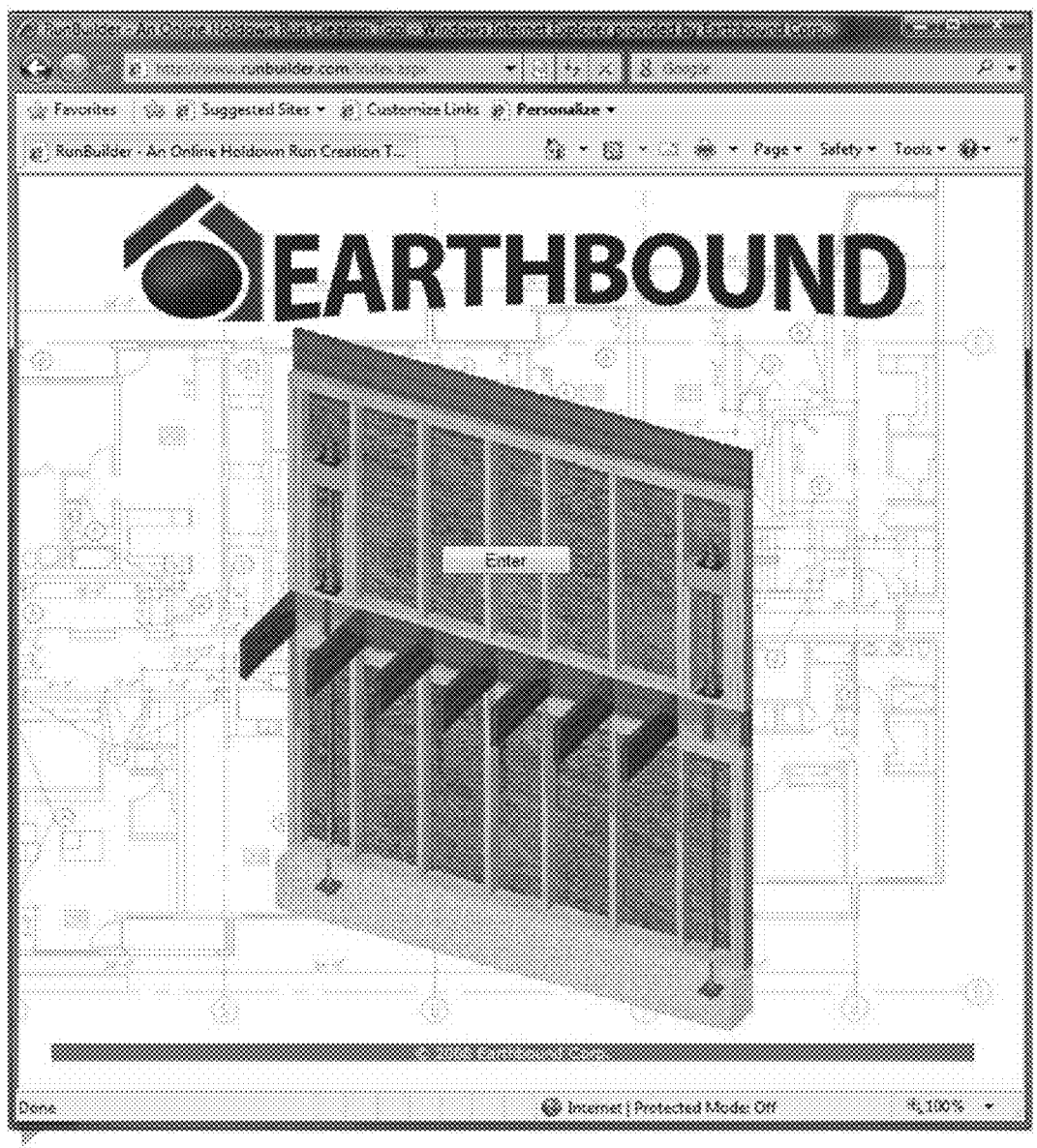
FIG. 8 is a screen shot of a splash page of the system of FIG. 5.

Referring to FIG. 8, a splash screen is shown. This site is created for use by structural engineers and those with the knowledge to understand the application of holdown systems in a wood frame structure. This tool assembles a report or drawing from a library of over 550 drawing elements and over 1000 hardware parts in 30 categories for the engineer design all done "on-the-fly," giving the engineer complete control over the design and dynamically out-putting the results in various formats.

It is assumed to a certain extent that the materials presented on this web site will be familiar to that audience and thus does not provide extensive education about how to use a holdown system in a wood frame structure. It is designed to assist those with the understanding in developing a holdown system to meet the criteria they have set forth in their design of the structure following building code standards for the location in which their building will reside.

The end result of using this system will be the immediate consumption of the DXF data provided as the result of the design criteria selected from and input into the system. The DXF data can be immediately placed into a set of contract drawings for the submittal process.

Figure 9:
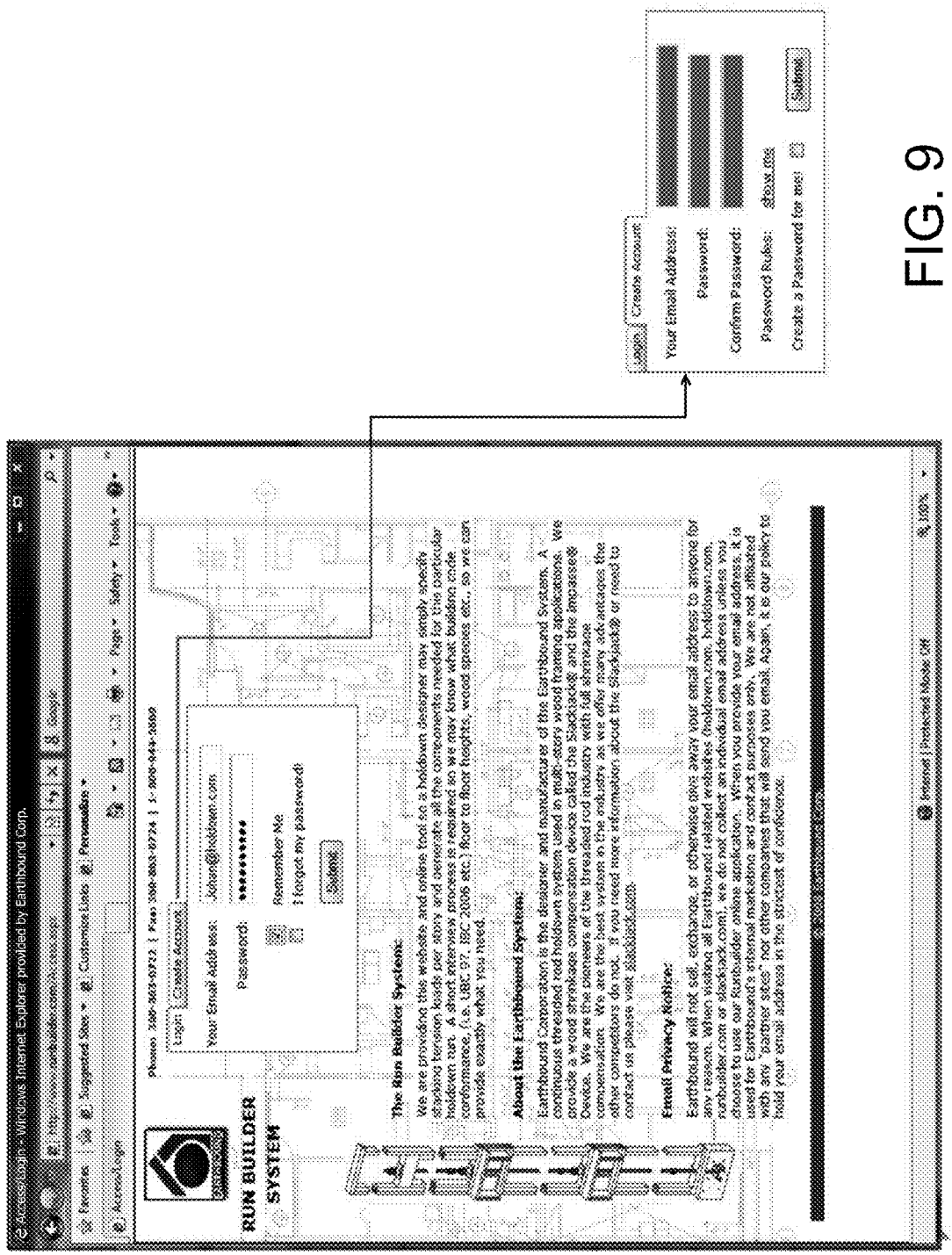
FIG. 9 is a screen shot of a login page of the system of FIG. 9.
Figure 10:
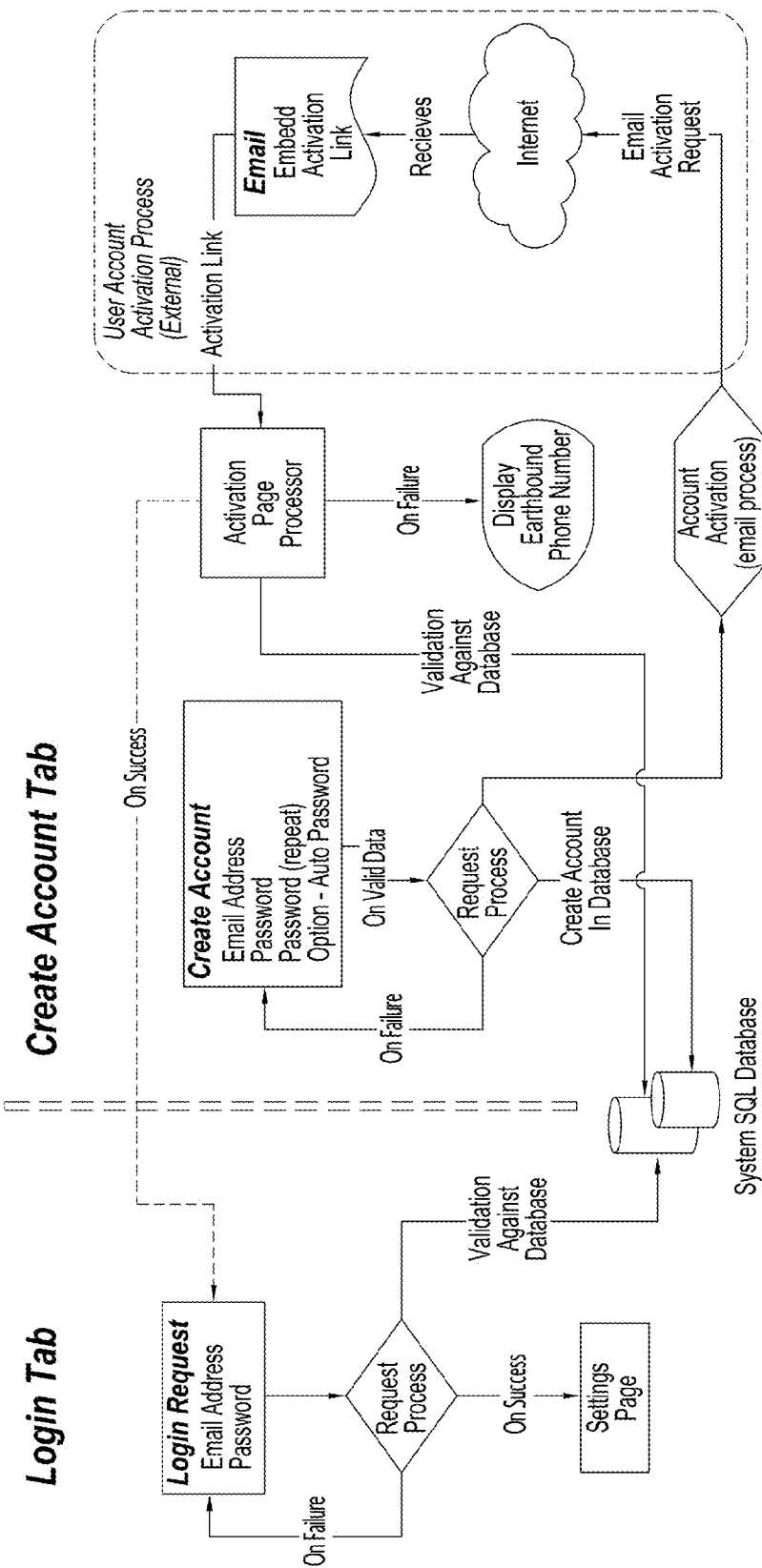
FIG. 10 is a process flow chart for login or creating an account in the system of FIG. 5.

Referring to FIG. 9, a login/account creation access page of the system is disclosed. FIG. 10 shows a process flow chart of the access page.

Figure 11:
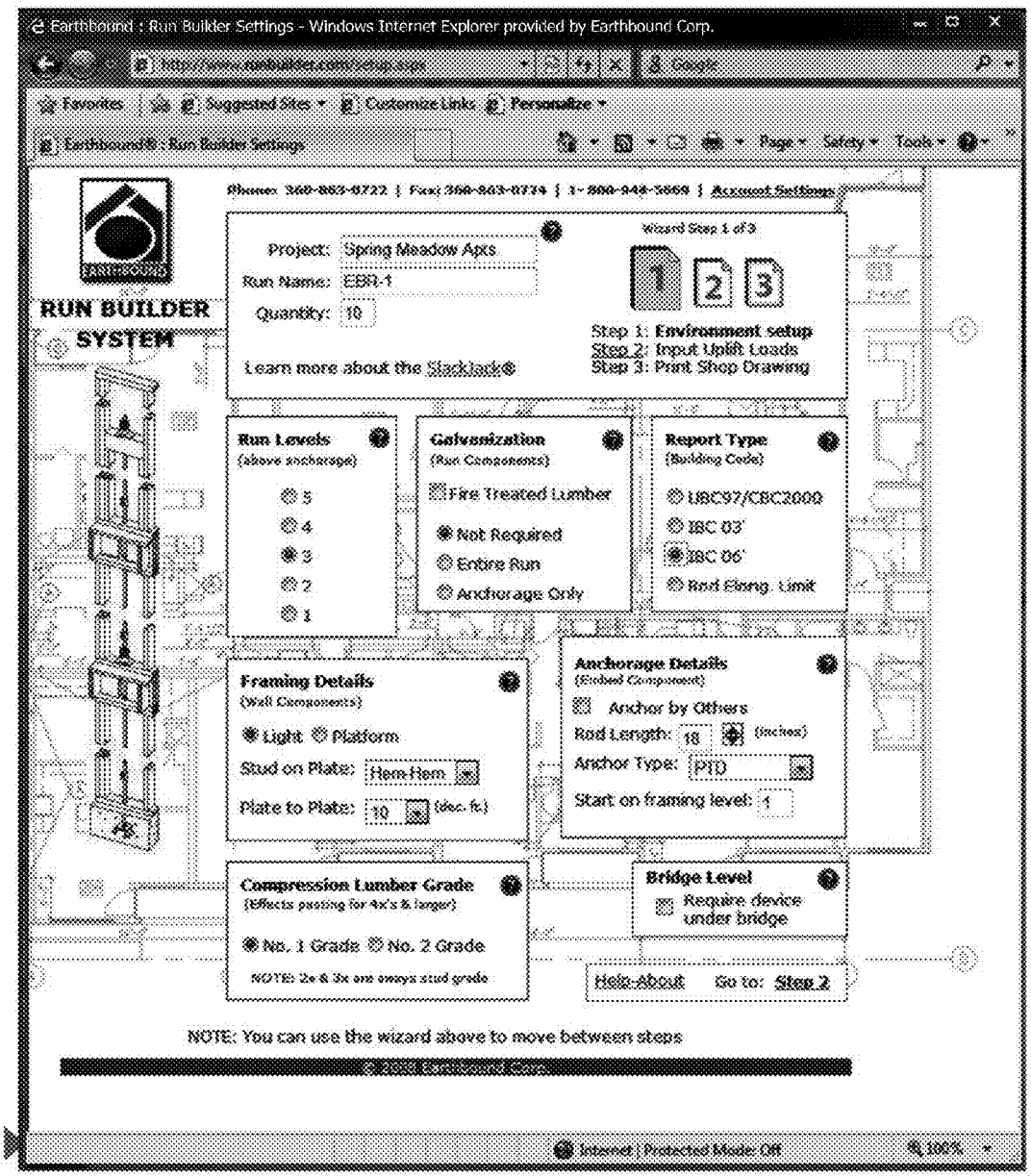
FIG. 11 is a screen shot of an Environmental Setup page for a sample project.
Figure 12:
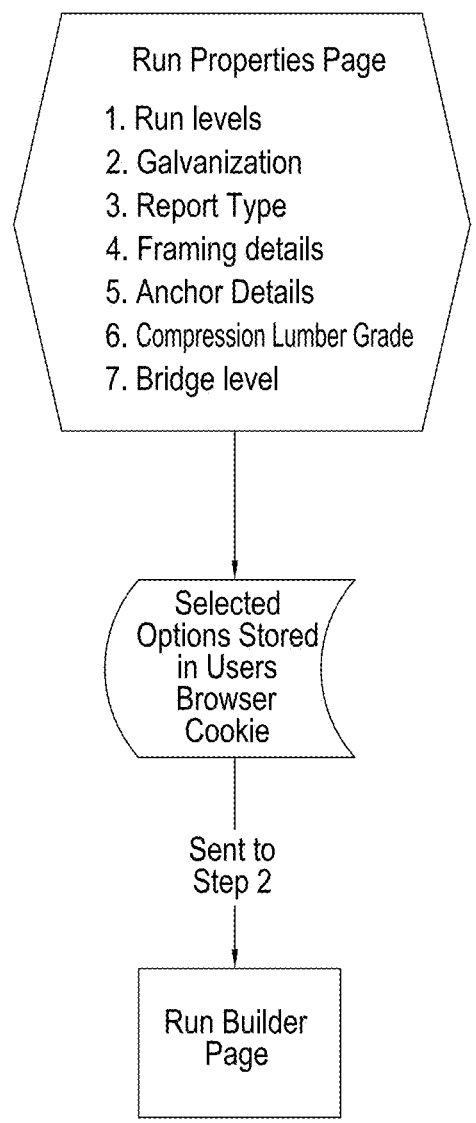
FIG. 12 is a process flow chart of the environmental setup step of the system of FIG. 5.

Referring to FIG. 11, the wizard step 1, environmental settings page of the system, is disclosed. FIG. 12 shows a process flow chart of the page. No calculations take place on this page. It is simply a criteria selection page.

Run Levels: The user will select the number that corresponds to the location in the wood frame structure where this system will be installed. The number will determine how many floors the rod system will travel. For each floor of travel there will be an uplift load defined by the engineer for that location in the structure. That load will be captured by the rod system to return that load down to the foundation as compression load. This is to prevent the wall in which it is located from tilting during a seismic event. Selection of the run level on this page will dynamically update the run image on the left side of the page to reflect the what the system would look like in the framing of the structure. Selection of this item dynamically updates the image on this page.

Galvanization: The user will select whether or not galvanization will be required. This will impact what parts are selected to add to the run design for field Installation. This selection has no bearing on any calculations.

Report Type: The user selects which Building Code will govern the structures engineering design principles. The report impacts how the rod is selected. Each of the Report Types or Building Codes affects how much load a rod can handle. The rod loads are available in a table structure in a database, thus selecting a report type will assign a rod that meets that building code criteria.

The Framing Details section contains several choices, as follows:

1. Light Framing verse Platform Framing: This affects how the system selects the appropriate drawing elements from the database to assemble for structure representation of that framing style. This option does not have any effects on calculations; it simply allows the system to represent the proper framing format in the final drawing output. Selection of this item dynamically updates the image on this page.

2. Stud on Plate: Wood species have different properties of strength, bending modulus, compression parallel to grain and fiber, etc. The selected combination of wood allows the system to propefly calculate the amount of lumber needed to add to the structure to handle the download force generated by the holdown system.

3. Plate to Plate: This is part of the calculation of the strength of the wood species selected by "Stud to Plate."

Anchor Details section contains several choices as follows:

1. Anchor By Others: Simply allows our system to note that the engineer has chosen another process to handle the details about the anchorage system. This will be noted on the drawing, if selected, "Anchor by Others." This does not impact any calculations.

2. Rod Length: Allows us to send the correct rod length the engineer has determined is needed for this holdown run.

3. Anchor Type: The engineer has determined what the anchor condition is in his structure. This allows the system to correctly identify the parts needed for this anchor. Example, if a PTD (post tension deck) is selected, the calculated uplift load is used to select the appropriate sized components; namely, anchor plate, rod, nuts and washers if required. Selection of this item dynamically updates the image on this page.

Compression Lumber Grade: Affects the wood strength and as with the previous wood related choices will determine the amount of lumber used in the structure to handle the compression load.

Bridge Level: Require device under bridge. Some engineers prefer to have a holdown device for each floor in the structure.

This option allows the engineer to override our system's ability to push the load of a lightly loaded structure up a floor to use less devices In the structure. This only affects the where the load will be located In the structure. Selection of this item dynamically updates the image on this page.

Figure 13:
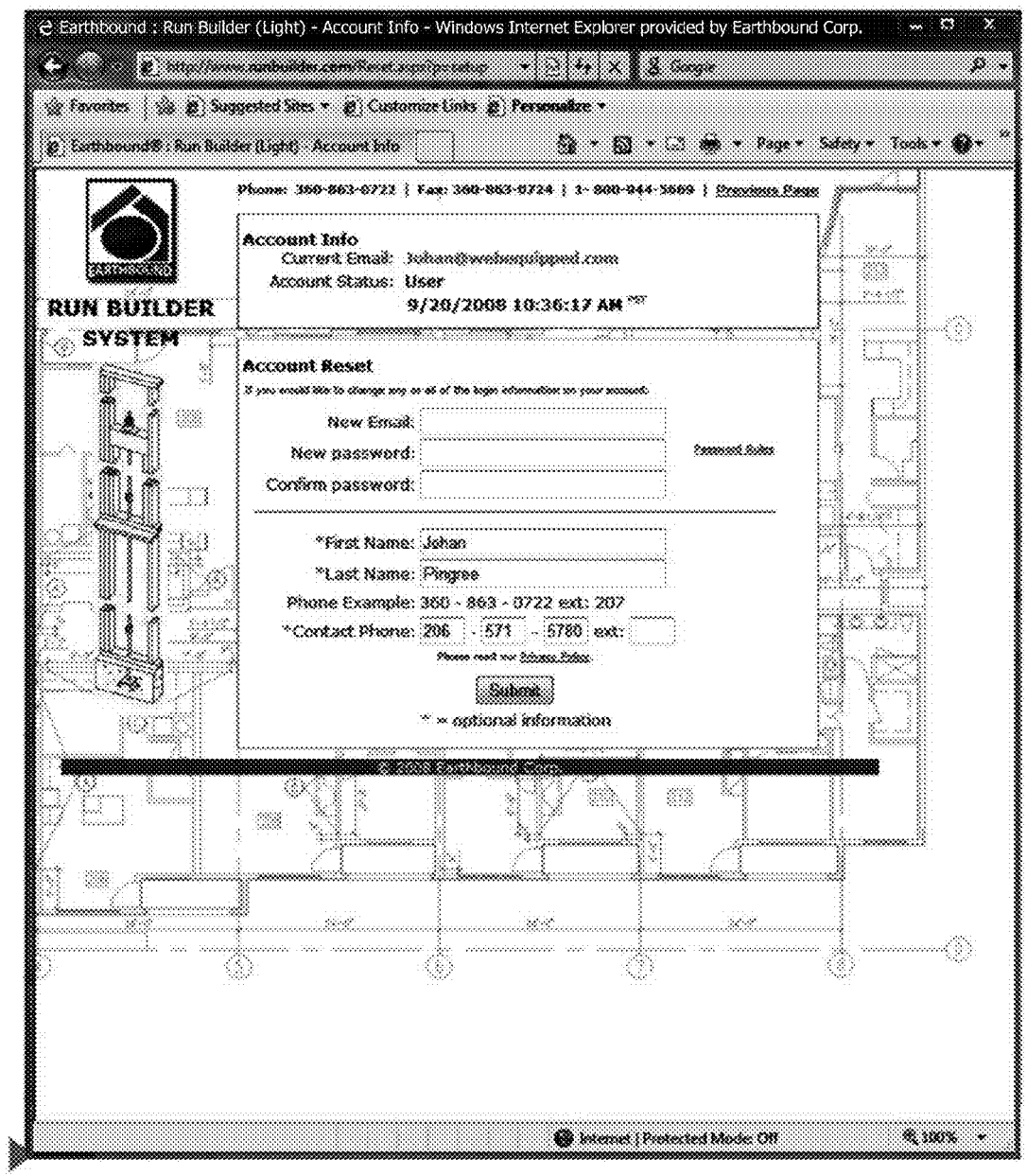
FIG. 13 is screen shot of a user account page of the system of FIG. 5.

Referring to FIG. 13, a user account page, including account information and password reset is shown. This page allows the logged in users to reset/change their password. Optionally they can provide the system more information about themselves.

Figure 14:
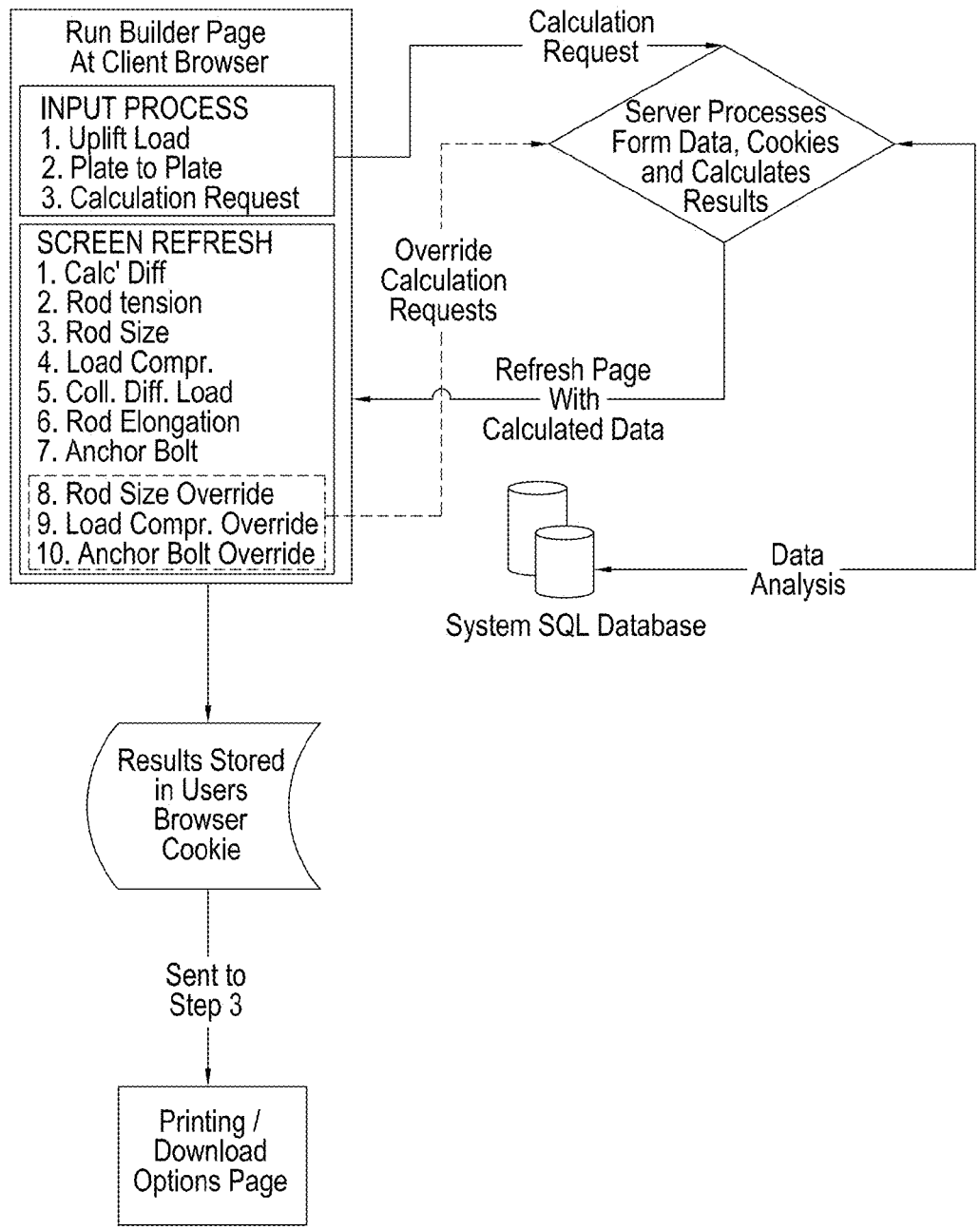
FIG. 14 is process flow chart of the Input Uplift Loads step of the system of FIG. 5.

Referring to FIG. 14, a process flow chart of the wizard step 2, Run Builder page of the system, is disclosed. Server processes (in order shown) for the wizard step 2 are:

1. Calculate the loads:
   a. Rod Tension: This is the per level tension load specified by the user.
   b. Calculated Differential Load: This is a calculation of the incremental tension load between stories.
   c. Collected Differential Load: This is typically to 1b. unless a device is skipped in the run.
   d. Compression loads: This is typically equal to 1a. unless the user provides a higher required value then,
   e. Determine what the loads are per floor and assign the loads to each floor.

RULE: Bridge load defines the lumber used for the bridge: Solid or Timberstrand.

2. Resolve Rod loading/size:
   a. Load the rod matrix from the database for the given Report Type/Building Code/b.
   Select the rod size that meets or exceeds the tension load required for that floor from the matrix.
   c. Check against the override value and choose the stronger of the two.
   d. Check for galvanization requirement and assign the nomenclature to the part.

3. Determine the holdown device location and size for each floor:
   RULE: If the run is three or more stories a 2" travel device is used in the upper 3 floors and a 1" travel device on the lower floors. If the run is below a four story run then 1" travel devices are assigned to all floors. Using the rule above, the rod size assigned to the given floor and the load assigned to that floor we can then determine the holdown to use for that floor.

4. Calculation of Rod Elongation (formula: F*L/A*E)
E=29000000, A=Rod area, L=Length of Wall (inches), F=Rod Tension (Force)
   a. Calculate the elongation for the rod assigned to each floor.

5. Calculate for anchor bolt size.
RULE: Minimum size in concrete anchorage is R5 (⅝" diameter).
RULE: Anchor bolt is always the same size or larger than that of the first floor.
This has an override option so the engineer can specify a larger anchor for the design.

6. Resolve coupler location and sizes for each floor.
   a. The system checks the rod size for each floor and ensure that the proper connecting coupler nomenclature is called out to match the rod above and below the connection point.
   b. The system checks for galvanization requirement and assigns the nomenclature to the part.

7. Calculates bearing plate location and size for each holdown location.
RULE: The system uses the collected differential load and rod size to determine the plate conditions.
   a. Rod size determines the hole size in the plate.
   b. The system loads a matrix of pre-engineered plate sizes (length, width, thickness, capacity, color) from the database.
The system takes the collected differential load and find a plate capacity that meets or exceeds the load for that floor.

8. Calculate the posting requirements for each floor.
RULE: If there are multiple floors then the first floor 4×8 corner post is allowed
RULE: 2×4 wall structure is the default posting type; others are shown as optional.
The calculation requires the following inputs:
   1) Wood Member Species (Doug Fir, Hem Fir, etc.)
   2) Wood member Grade {Stud Grade, No. 1, No. 2, etc. in accordance to 2005 NDS (National Design Specifications for Wood Construction).
   3) Wood Member Height in feet (derived from plate to plate dimension).
   4) Wood Member Species of horizontal wood member (also known as "bottom plate"). The wood compression calculation method chooses the lower of the following:
      a) Capacity of the vertical member bearing area down to the horizontal wood bearing member. Building code refers to the NDS to stipulate a maximum compression pressure to the bottom plate depending on the wood species.
      b) Capacity of Column Buckling: Capacity of maximum allowed compressive stress due to the axial downward force.
The calculation method feeds the inputs above along with standardized lumber sizes using actual dimensions (i.e. 2×4=1.5"×3.5" up to 4×12 for 4" width walls and 6×10 for 6" width walls) and develops the proper combination of minimum wood members required to meet the specified compression load. The compression load typically is equal to the tension load given of a particular level, but the user can manually specify a higher compression load if required by their determination.

It is worth noting that the system stores much of the calculated data in a server session are variable for use during the Wizard Step 3, printing and drawing download process. The data from Wizard Step 1 is carried forward in the browsers cookies along with the uplift loads and plate to plate heights from this page.

Figure 15A:
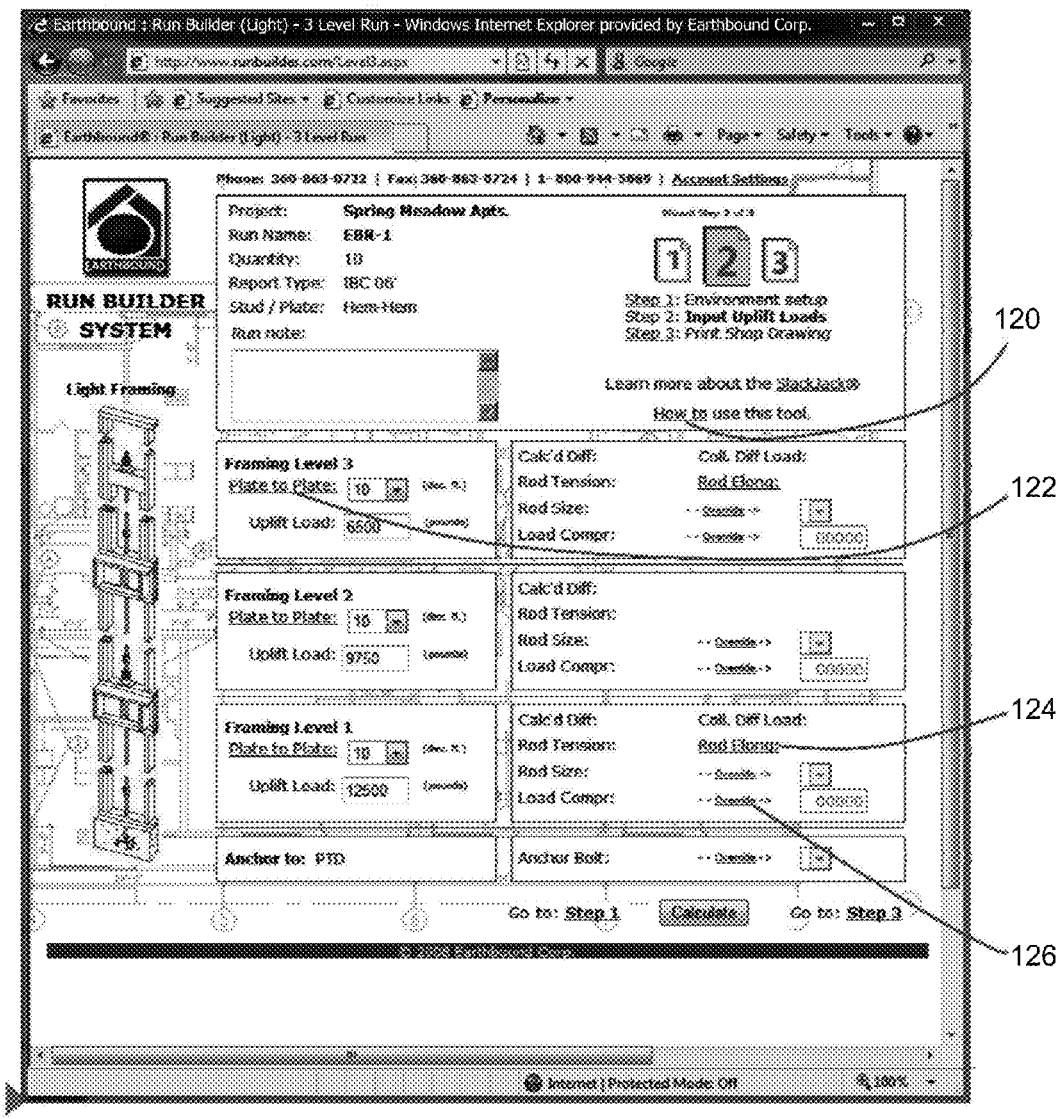
FIG. 15A is a screen shot of the Input Uplift Loads step of the system of FIG. 5.
Figure 15D:
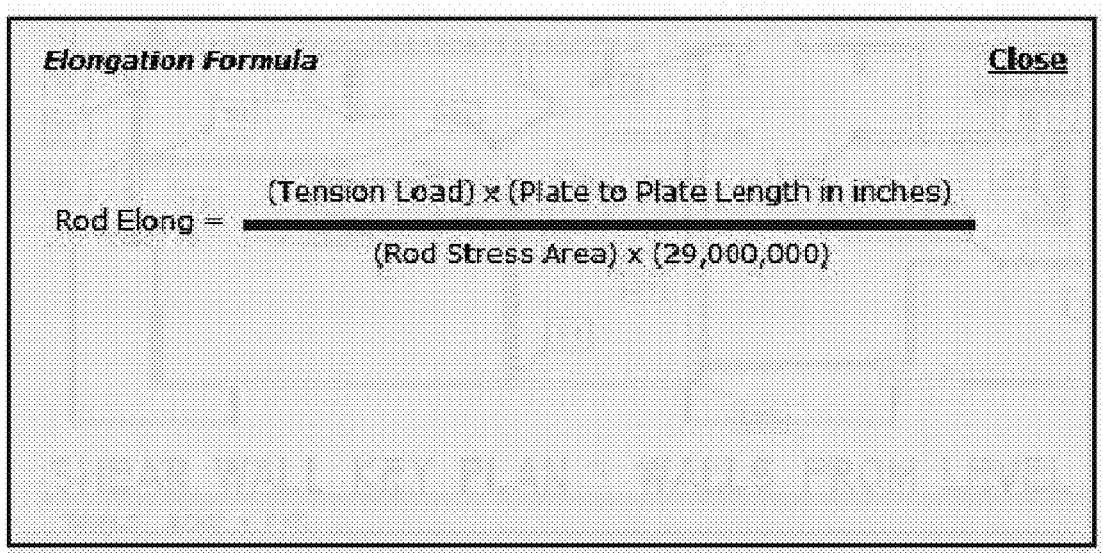
Figure 15E:
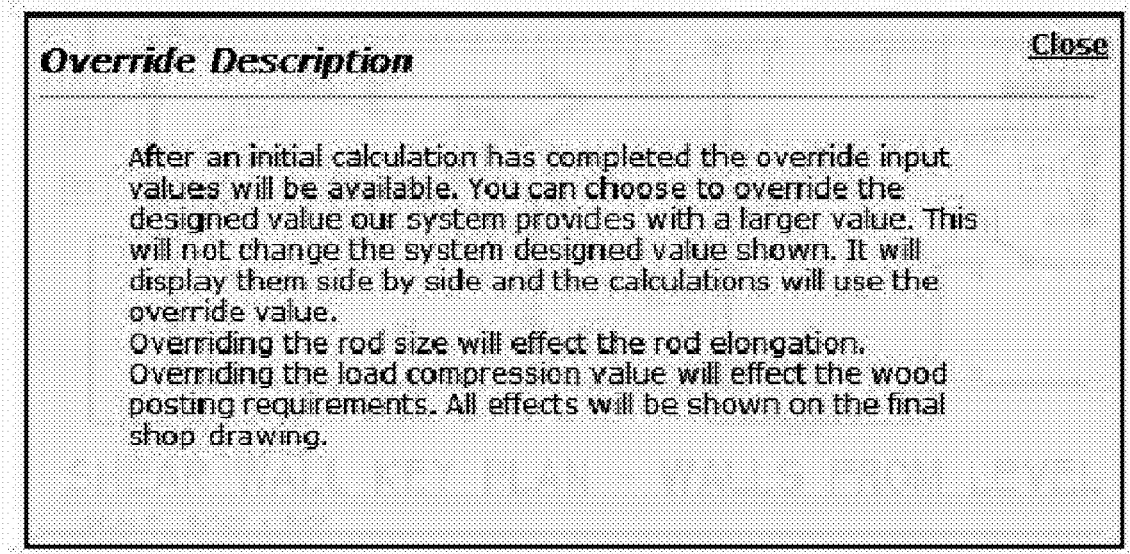

Referring to FIGS. 15A-15E, the system data input page is shown. Referring to FIG. 15A, clicking the hypertext "How to" at 120 yields a window shown in FIG. 15B. Clicking the hypertext "Plate to Plate" at 122 yields a window shown in FIG. 15C. Clicking the hypertext "Rod Elongation" at 124 yields a window shown in FIG. 15D. Clicking the hypertext "Override" at 126 yields a window shown in FIG. 15E.

Figure 16:
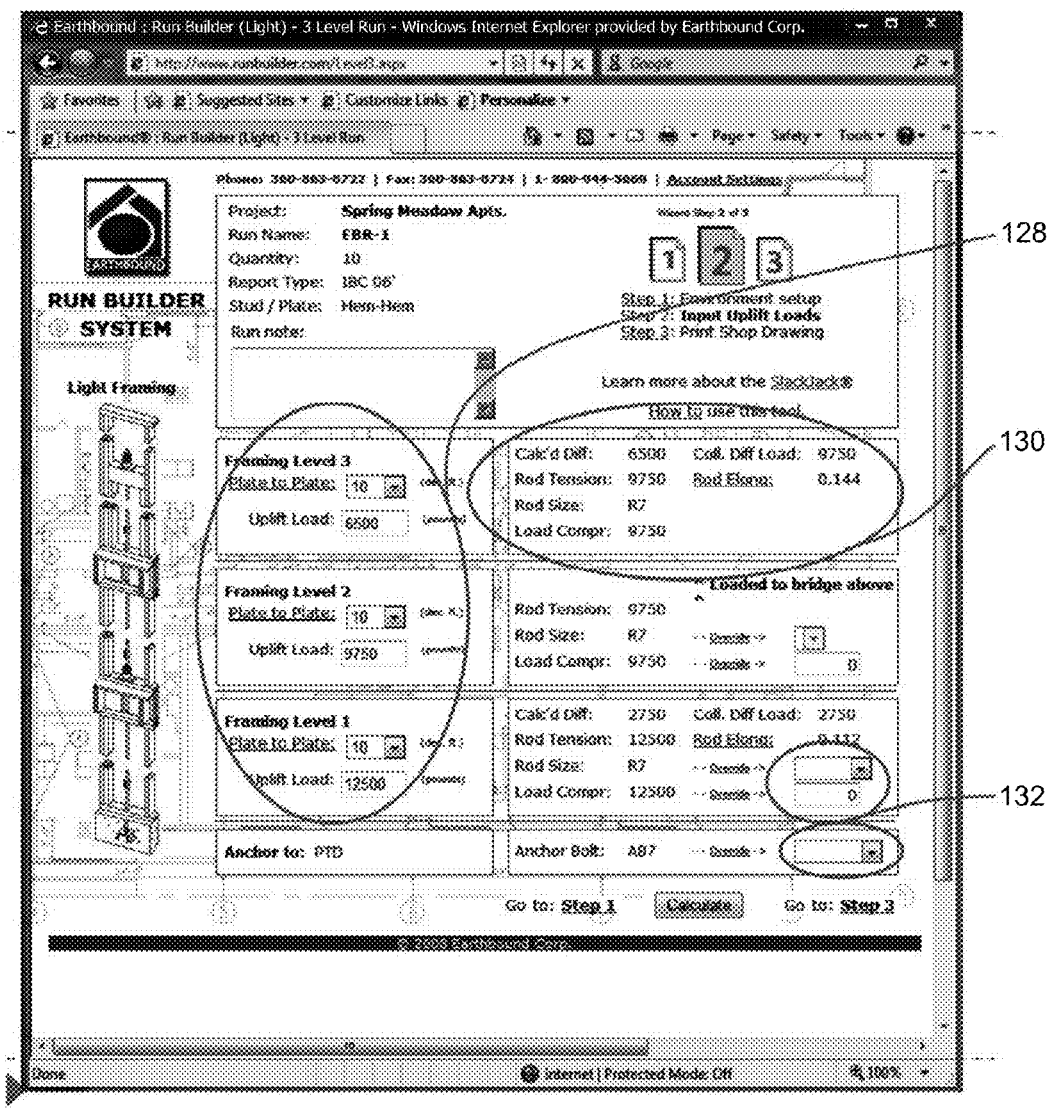
FIG. 16 is a screen shot of FIG. 15A showing an area for entry of the uplift load and wall height, an area for displaying the calculated values and an area where overrides may be exercised.

Referring to FIG. 16, the user inputs the uplift load and wall height at 128 and the calculated values are returned at 130 from the server after a posted calculation request. Typical override options at 132 available after the return of the calculated data are rod size over sizing, anchor bolt over sizing and compression loading increase.

Figure 17:
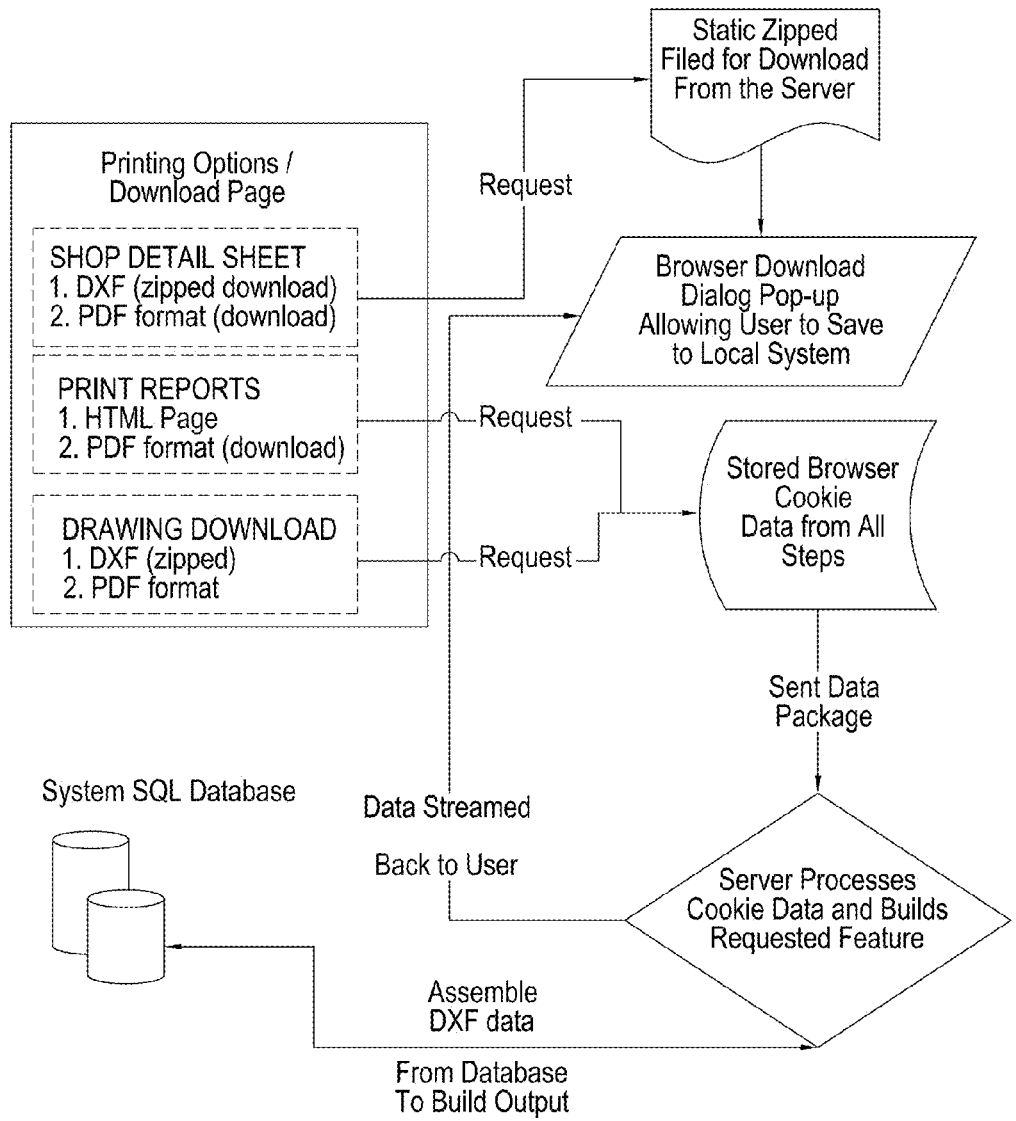
FIG. 17 is a process flow chart for the Print Shop Drawing step of the system of FIG. 5.

Referring to FIG. 17, a process flow chart of the Wizard Step 3 Printing Download Options Page of the system is disclosed. The server process for the Wizard Step 3 are:

The previous step (Wizard Step 2) has calculated all the loads, hardware and compression lumber (posting) needed to build this run. The report process is basically a formatting function to show the load values in tabularized form and to organize the hardware such that it is aligned in the report to match the location of the structure where it is installed. The same basic concept applies to the construction of the DXF (drawing exchange file) for use In CAD, albeit a more complicated process due to the nature of the environment that pertains to CAD.

Shop Detail Sheet Downloads are pre-built boilerplate zipped files. The links are to those static files.

1. Print Reports
   a. The system takes all the data stored in the server session and cookies and formats it to fit a HTML document as a report.
   b. If it is flagged to be in PDF format, the system runs the same process for building the HTML document and converts the document to PDF format.

2. Drawing Download
The system loops through each floor and from the database library of DXF templates, and the system loads the appropriate template to match the floor (level), anchorage, bridge and posting condition. The system manipulates each DXF template by loading into the DXF template the proper hardware call-outs: rod size, coupler, bearing plate, holdown, posting schedule, etc.

Once this build process is complete the system compresses the DXF into zip format for download to the user. If the user requests it in PDF format, the system runs the DXF through a conversion process prior to compression to zip file format.

Figure 18:
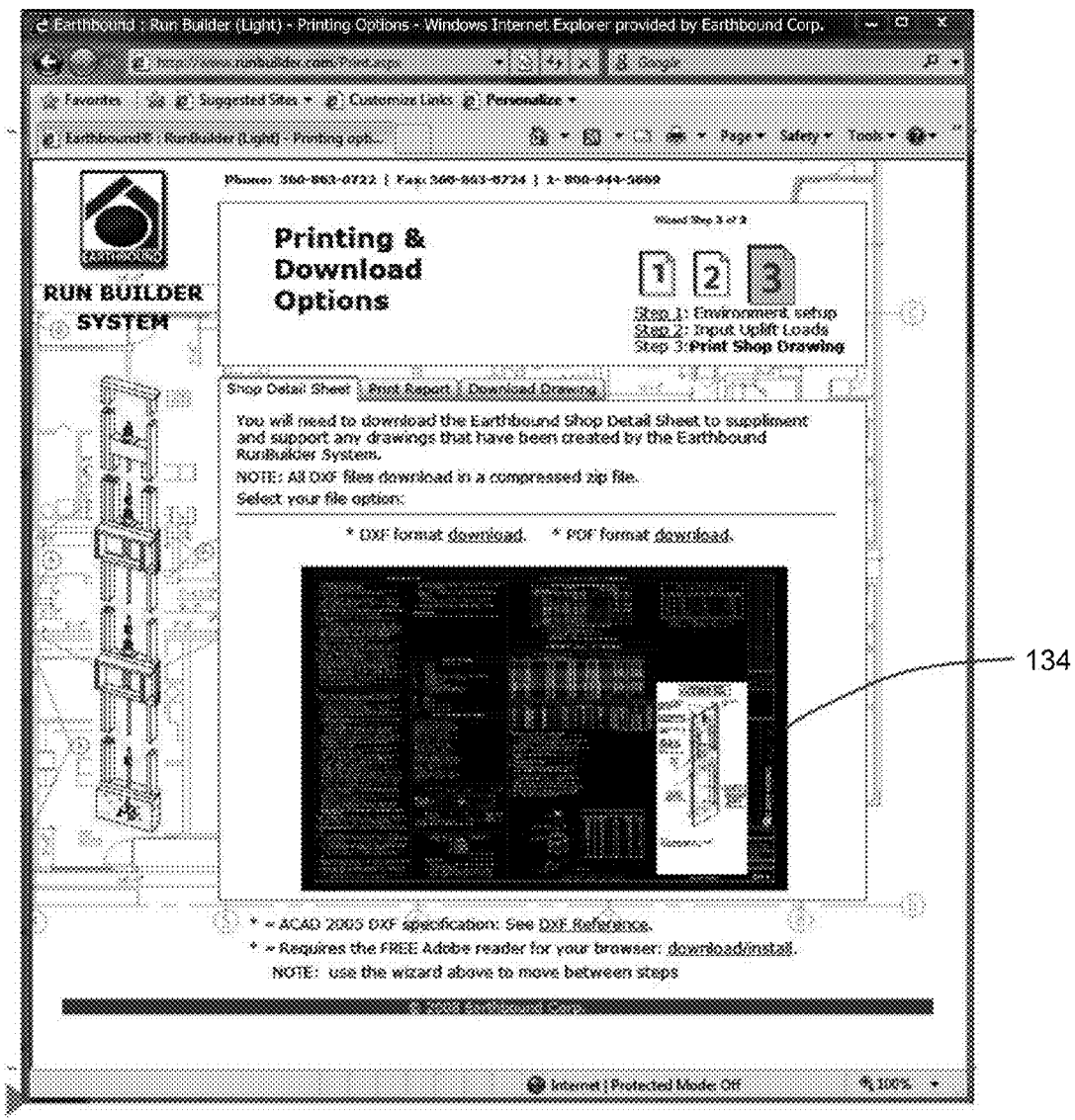
FIG. 18 shows a screen shot of the Print Shop Drawing step, Shot Detail Sheet tab, of the system of FIG. 5.

Referring to FIG. 18, the Shop Detail Sheet tab, Wizard Step 3, shows a sample view of a shop drawing at 134. Downloadable pre-built run support drawings provide validation to the runs built by this system.

Figure 19:
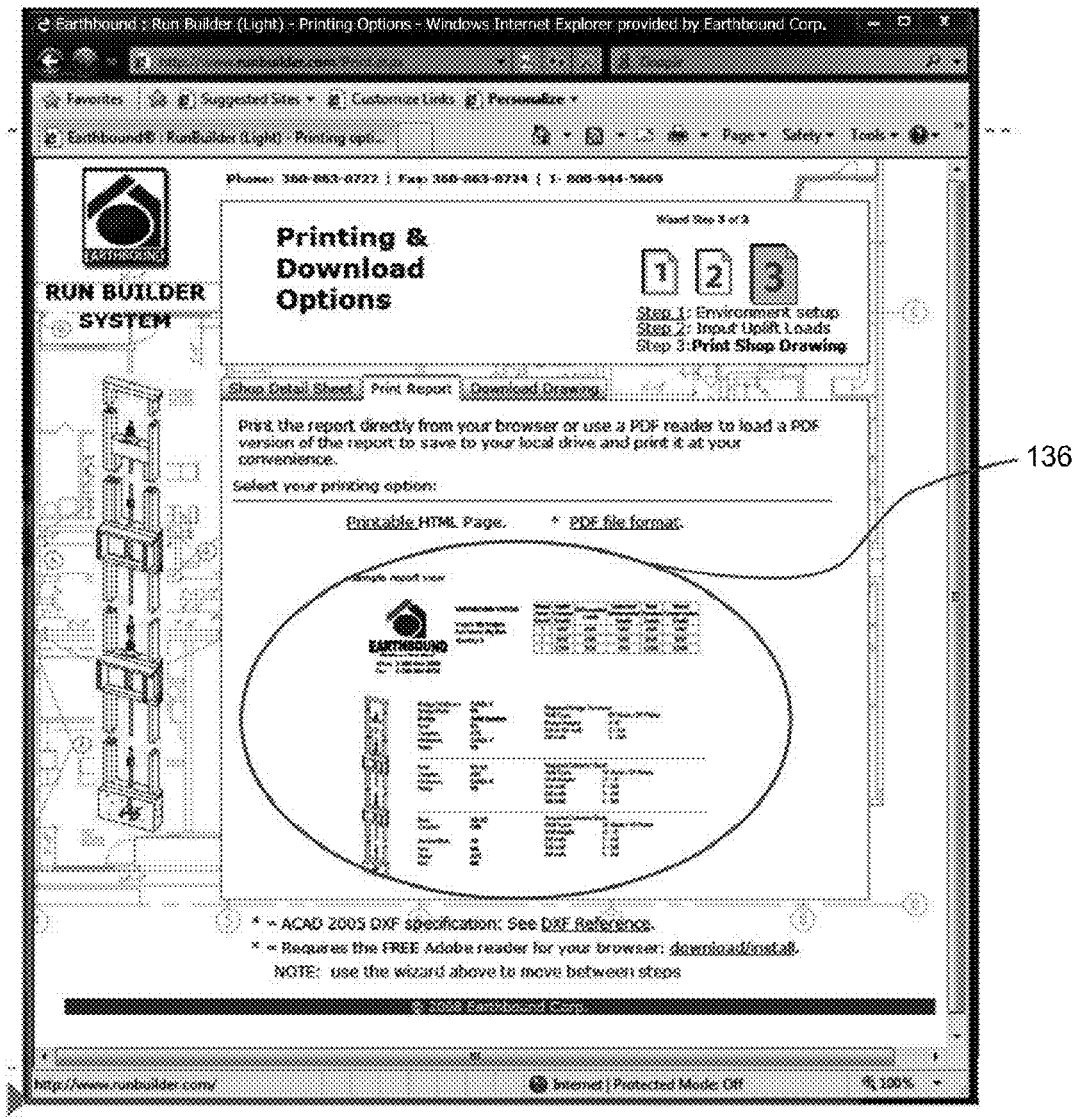
FIG. 19 shows a screen shot of the Print Shop Drawing step, Print Report tab, of the system of FIG. 5.

Referring to FIG. 19, the Print/Download Report tab allows user to download a report of the elements that make up the run built in the previous steps. Sample or current report depicted on this tab at 136 contains:
Image of Run as it would exist in the structure;
Schedule of components need to build the run in the structure;
Table of calculated loads;
Schedule of Compression Lumber options.

Figure 20:
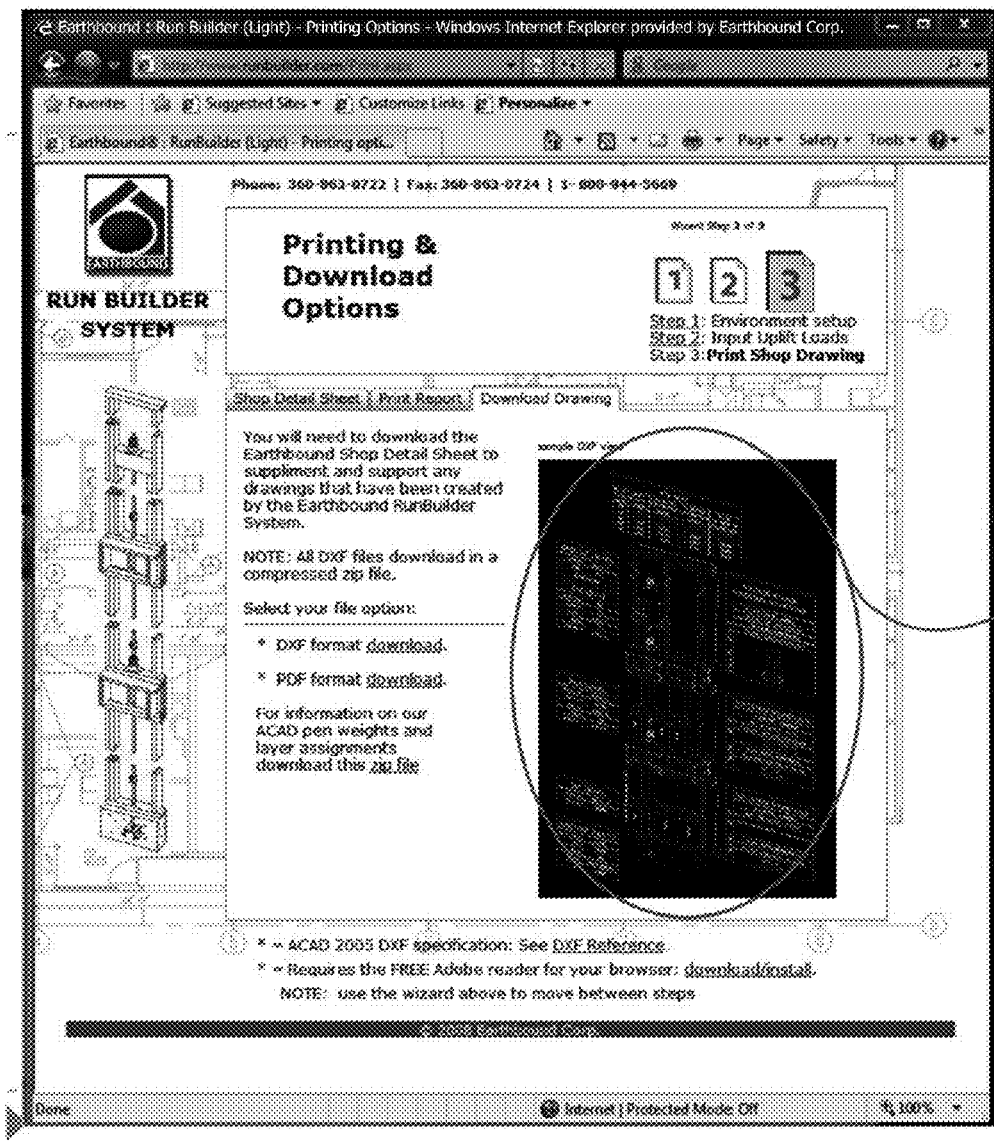
FIG. 20 shows a screen shot of the Print Shop Drawing step, Download Drawing tab, of the system of FIG. 5.

Referring to FIG. 20, the Download Drawing tab shows sample or current view at 138 of a DXF generated for use in CAD systems. See FIG. 25.

DXF data/Drawing contains:

Framing elements of the building structure in which the holdown system is installed;

Schedule of components needed to build the run in the structure;

Table of calculated loads;

Schedule of Compression Lumber options.

Figure 21:
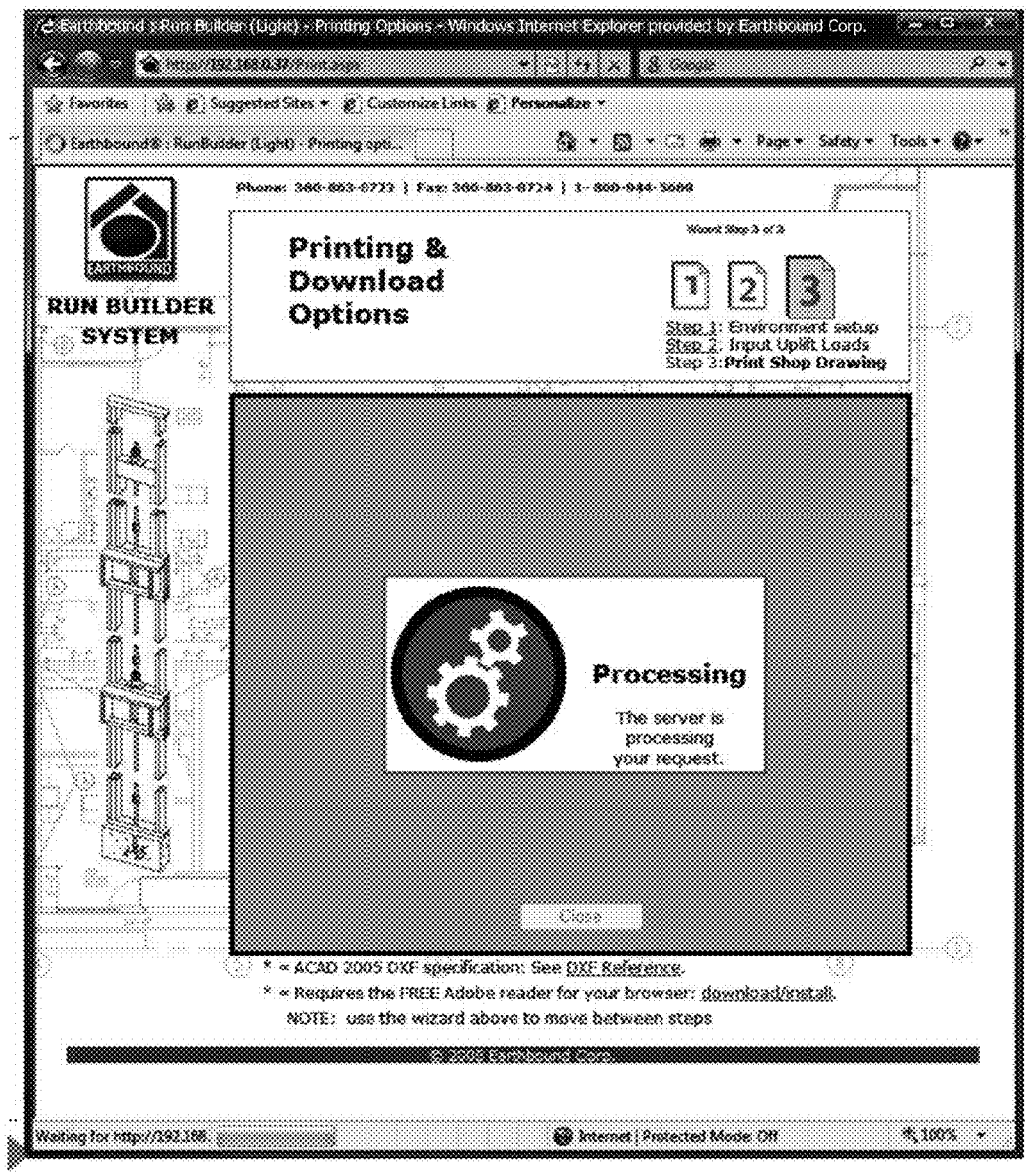
FIG. 21 is a screen shot of a page showing processing of a download drawing request.

Referring to FIG. 21, a page shows download request processing. The page displays the activity to the client browser.

Figure 22:
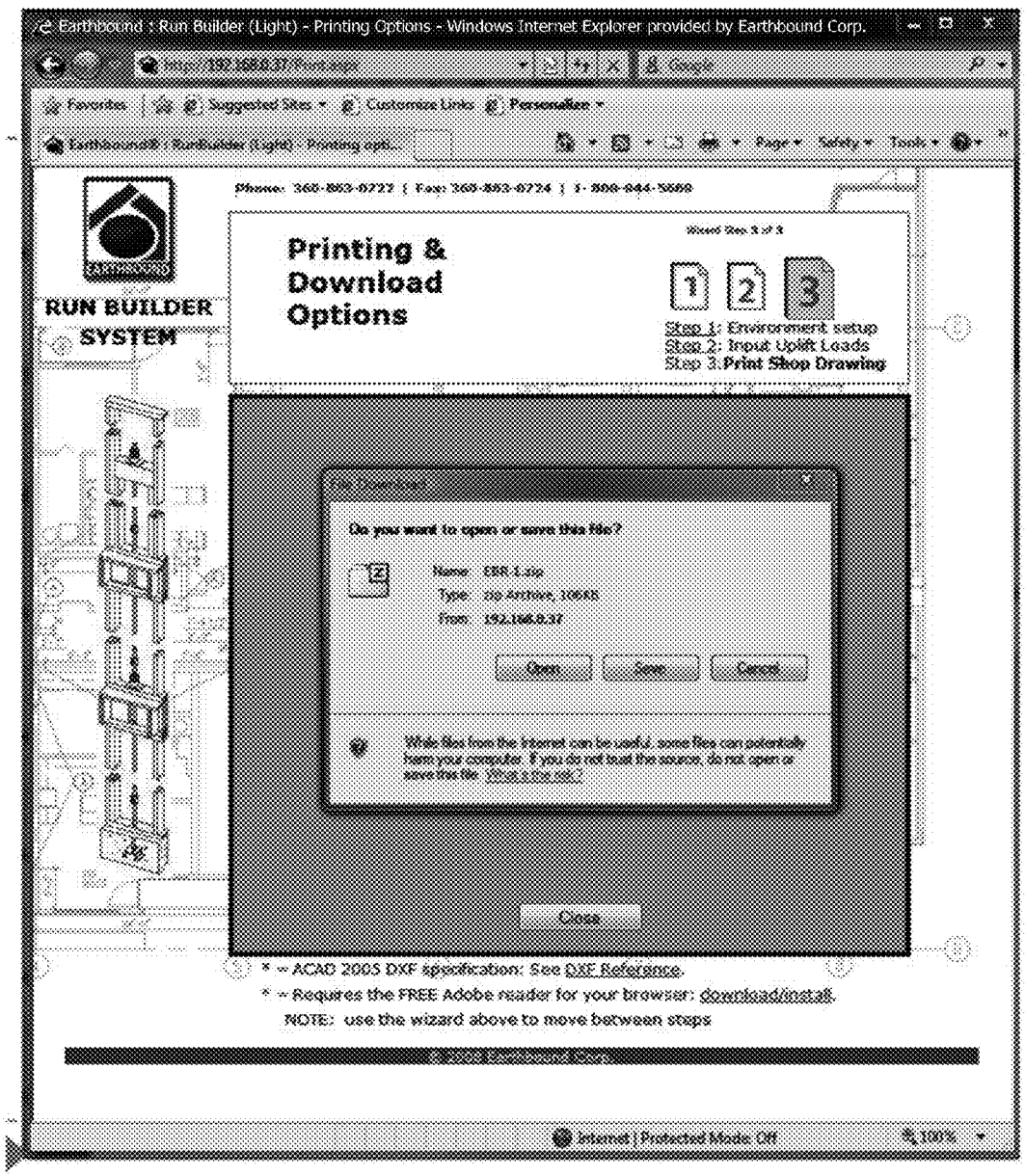
FIG. 22 is a screen shot of a page showing a dialogue box to open or save the downloaded file.

Referring to FIG. 22, the server has finished producing the downloadable data requested by the user, report or drawing in the format chosen, and notifies the client browser to allow the user to save it to their local system or open it directly on their system.

Figure 23:
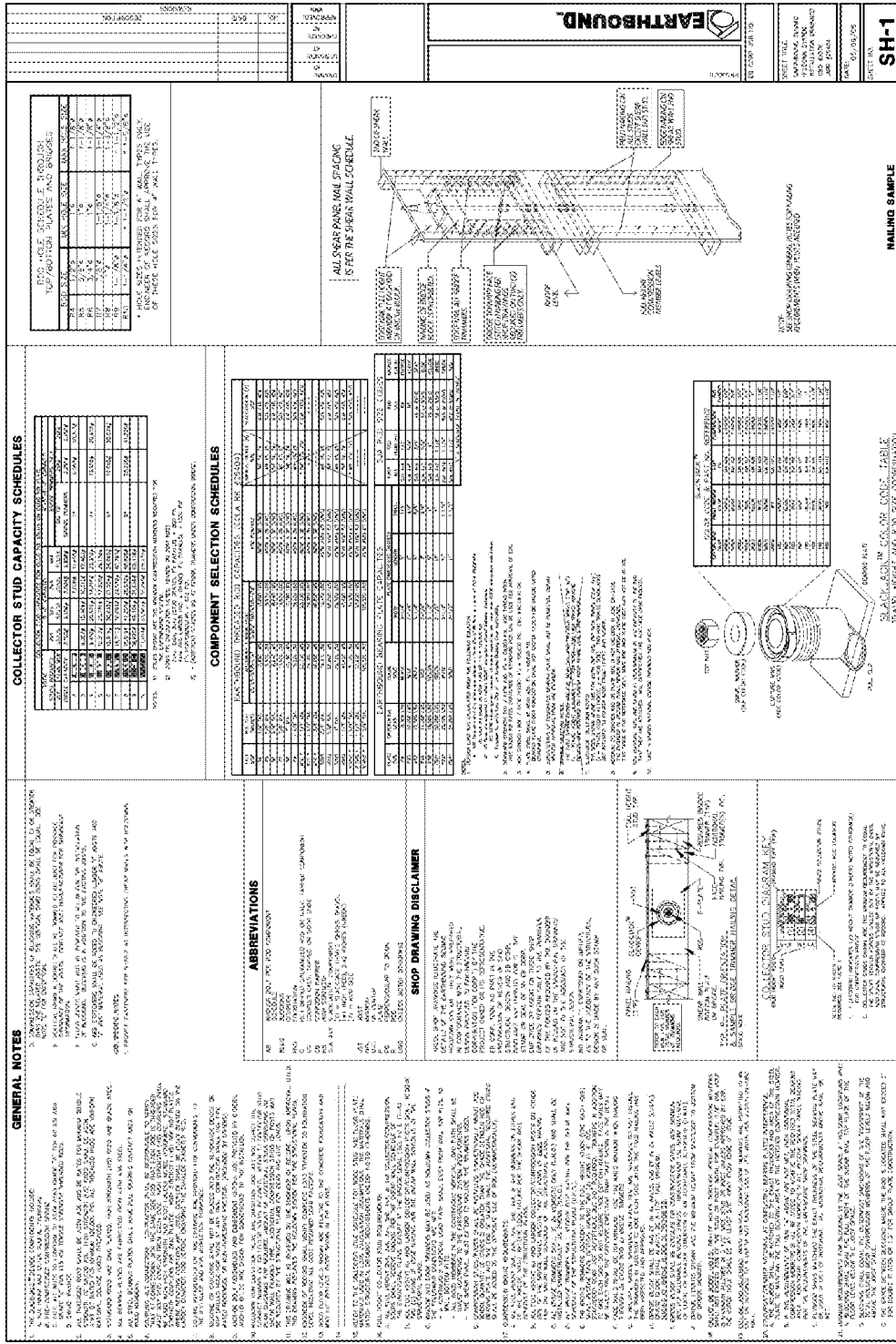
FIG. 23 is a sample shop drawing.

Referring to FIG. 23, a sample shop detail sheet is shown.

A sample report is shown in FIG. 24.

Figure 25:
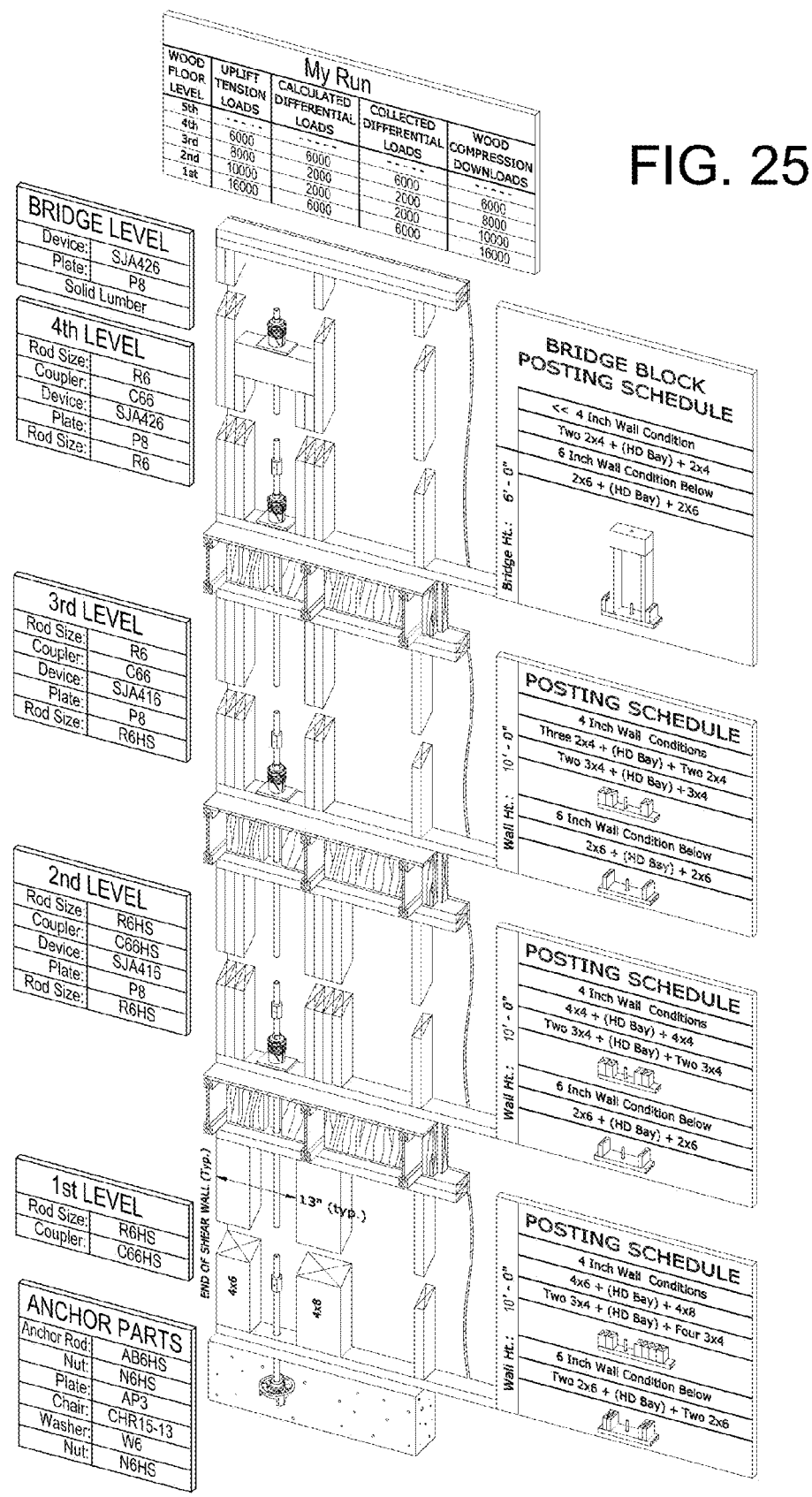
FIG. 25 is a sample downloaded drawing shown in FIG. 20 of the Download Drawing tab page.

A sample drawing is shown in FIG. 25.

While this invention has been described as having preferred design, it is understood that it is capable of further modification, uses and/or adaptations following in general the principle of the invention and including such departures from the present disclosure as come within known or customary practice in the art to which the invention pertains, and as may be applied to the essential features set forth, and fall within the scope of the invention.

We claim:

1. A computerized online engineering tool system for specifying the various components of a holdown system that assemble a run comprising a tie rod extending inside a frame wall structure from the foundation up through the walls to the top floor, and bearing members and tension devices securing the tie rod to the wall, said system comprising:
    a) a server;
    b) a database of drawing elements and hardware component parts;
    c) a program operably associated with said server and said database; and
    d) said program including the steps of:
        i) allowing a user to login into the server;
        ii) allowing the user to select options for the run;
        iii) allowing the user to input load at each framing level and displaying to the user a rod size sufficient to handle the load; and
        iv) allowing the user to download a shop or installation drawing of the run generated using the drawing elements and hardware component parts from the database.

2. The computerized online engineering tool system as in claim 1, wherein allowing the user to select options includes a settings page for selecting run levels, applicable building code, framing details, anchor details, compression lumber species, uplift loads or plate to plate distance.

3. The computerized online engineering tool system as in claim 2, wherein:
    a) said settings page includes an image of the run; and
    b) said image is dynamically updated as the user enters options for the run.

4. The computerized online engineering tool system as in claim 2, wherein the run levels are single story, two story, three story, four story, five story, six story or seven story.

5. The computerized online engineering tool system as in claim 2, wherein the building code includes UBC (Uniform Building Code) 97/CBC (California Building Code) 2000, IBC (International Building Code) 2003, IBC 2006 or IBC 2009.

6. The computerized online engineering tool system as in claim 2, wherein the framing details include selections for light framing or platform framing, wood species or plate to plate distance.

7. The computerized online engineering tool system as in claim 2, wherein the anchorage details include selections for anchor type.

8. The computerized online engineering tool system as in claim 7, wherein the selections for anchor type include post tension deck (PTD), slab on grade (SOG), slab drilled and epoxy studs inserted (Epoxy), coupler welded to beam (Steelbeam), or drilled and secured from the bottom of the woodbeam (Woodbeam) foundation walls.

9. The computerized online engineering tool system as in claim 2, wherein the compression lumber grade includes selections for No. 1 or No. 2 grade.

10. The computerized online engineering tool system as in claim 2, wherein the bridge level includes an option of requiring a holdown device under a bridge.

11. The computerized online engineering tool system as in claim 2, wherein the compression lumber species includes selections for Hem Fir, Doug Fir, Southern Yellow Pine (SYP) (or other wood species variants) or any combinations thereof.

12. The computerized online engineering tool system as in claim 2, wherein the load includes uplift, tension, overturning loads or user specified uplift load at each level.

13. The computerized online engineering tool system as in claim 1, wherein the database includes a library of DXF (drawing exchange file) templates.

14. The computerized online engineering tool system as in claim 1, wherein allowing the user to input load includes a data input and calculated data page showing calculated rod elongation at a framing level.

15. The computerized online engineering tool system as in claim 14, wherein the rod elongation is calculated as follows:

$$\text{Rod elongation} = P*L/A*E,$$

where, $E=29,000,000$, $A$=Rod Area, in square inches, $L$=Length of Wall (plate to plate height), in inches (in), $P$=Rod Tension Force, in pounds, specified by the user as per level tension load.

16. The computerized online engineering tool system as in claim 1, wherein allowing the user to download a shop or installation drawing includes providing the user a print and download page.

17. A method for specifying the various components of a holdown system that assemble a run, comprising a tie rod extending inside a frame wall structure from the foundation through the wall up to the top floor, and bearing members and tension devices securing the tie rod to the wall, said method comprising the steps of:
    e) connecting to a server which includes a database of drawing elements and hardware component parts;
    b) selecting options for the run;
    c) inputting load at each framing level and displaying rod size sufficient for carrying the load; and
    d) printing a shop or installation drawing of the run meeting the load, including a table of calculated values, or a schedule of components needed to build the run using the drawing elements and hardware component parts from the database.

18. A method as in claim 17, and further comprising the step of calculating rod elongation at least at one one framing level.

19. A method as in claim 18, and further comprising the step of calculating rod elongation as follows:

Rod elongation=$P*L/A*E$, where, E=29,000,000,
A=Rod Area, in square inches,
L=Length of Wall (plate to plate height), in inches (in),
P=Rod Tension Force, in pounds, specified by the user as per level tension load.

20. A method as in claim 17, wherein the step of selecting options includes displaying on the user's computer a settings page.

21. A method as in claim 17, wherein the step of inputting load includes displaying on the user's computer a data input and calculation page.

\* \* \* \* \*